(12) United States Patent
Sugo et al.

(10) Patent No.: US 8,796,410 B2
(45) Date of Patent: Aug. 5, 2014

(54) POLYMER HAVING SILPHENYLENE AND SILOXANE STRUCTURES, A METHOD OF PREPARING THE SAME, AN ADHESIVE COMPOSITION, AN ADHESIVE SHEET, A PROTECTIVE MATERIAL FOR A SEMICONDUCTOR DEVICE, AND A SEMICONDUCTOR DEVICE

(75) Inventors: Michihiro Sugo, Annaka (JP); Kazunori Kondo, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 271 days.

(21) Appl. No.: 13/469,764

(22) Filed: May 11, 2012

(65) Prior Publication Data

US 2012/0299203 A1 Nov. 29, 2012

(30) Foreign Application Priority Data

May 23, 2011 (JP) .................................. 2011-115020
May 23, 2011 (JP) .................................. 2011-115022

(51) Int. Cl.
*C08G 77/08* (2006.01)

(52) U.S. Cl.
USPC ................. 528/35; 528/15; 528/31; 528/32; 528/27; 528/29; 525/476; 428/447

(58) Field of Classification Search
USPC ............. 528/15, 31, 32, 27, 29, 35; 525/476; 428/447
See application file for complete search history.

(56) References Cited

U.S. PATENT DOCUMENTS

| | | | |
|---|---|---|---|
| 6,680,007 B2 * | 1/2004 | Honda et al. | 252/511 |
| 7,132,220 B2 | 11/2006 | Arai et al. | |
| 7,785,766 B2 | 8/2010 | Kato et al. | |
| 8,124,715 B2 * | 2/2012 | Tanaka et al. | 528/32 |
| 2008/0182087 A1 * | 7/2008 | Kato et al. | 428/195.1 |
| 2008/0308225 A1 * | 12/2008 | Kanamaru et al. | 156/322 |
| 2011/0006419 A1 | 1/2011 | Hirano | |
| 2011/0076465 A1 * | 3/2011 | Takeda et al. | 428/195.1 |

FOREIGN PATENT DOCUMENTS

| | | | |
|---|---|---|---|
| JP | B2-3944734 | | 7/2007 |
| JP | A-2007-217708 | | 8/2007 |
| JP | 2008-143954 | * | 6/2008 |
| JP | 2008-150506 | * | 7/2008 |
| JP | A-2008-184571 | | 8/2008 |
| JP | A-2009-239138 | | 10/2009 |

* cited by examiner

*Primary Examiner* — Margaret Moore
(74) *Attorney, Agent, or Firm* — Oliff PLC

(57) ABSTRACT

One aspect of the present invention provides a polymer having repeating units represented by the formulas (1-1), (1-2) and (1-3) and weight-average molecular weight of from 3,000 to 500,000, as determined by GPC using tetrahydrofuran as a solvent, reduced to polystyrene. Another aspect of the present invention provides an adhesive composition comprising (A) the polymer, (B) a thermosetting resin, and (C) a compound having flux activity. Further, the present invention provides an adhesive sheet having an adhesive layer made of the adhesive composition, a protective material for a semiconductor device, which has the adhesive layer, and a semiconductor device having a cured product obtained from the adhesive composition.

16 Claims, 5 Drawing Sheets

POLYMER HAVING SILPHENYLENE AND SILOXANE STRUCTURES, A METHOD OF PREPARING THE SAME, AN ADHESIVE COMPOSITION, AN ADHESIVE SHEET, A PROTECTIVE MATERIAL FOR A SEMICONDUCTOR DEVICE, AND A SEMICONDUCTOR DEVICE

CROSS REFERENCE

This application claims the benefits of Japanese Patent Application No. 2011-115020 and No. 2011-115022 both filed on May 23, 2011, the contents of which are herein incorporated by reference.

FIELD OF THE INVENTION

The present invention relates to a polymer having silphenylene and siloxane structures and a method of preparing the polymer. Additionally, the present invention relates to an adhesive composition, specifically an adhesive composition which is used suitably for preparing a semiconductor device in a flips-chip mounting method. Further, the present invention relates to an adhesive sheet and a protective material for a semiconductor device which have an adhesive layer made of the adhesive composition, and a semiconductor device having a cured product obtained from the adhesive composition.

BACKGROUND OF THE INVENTION

Recently, wafers for semiconductors are getting larger and thinner and electronic parts are getting smaller and more precise, so that resin materials are required to have advanced functions. Silicone materials have good insulation property, flexibility, heat resistance and transparency and, therefore, is broadly used as resin materials for semiconductor devices and electronic parts.

Japanese Patent No. 3944734 discloses a polymeric compound having siloxane and bisphenol structures and a photo-curable resin composition comprising the polymeric compound. Japanese Patent No. 3949734 describes that the polymeric compound can be exposed with a light having a wide range of wavelengths to form a fine pattern which has high elasticity and good transparency and the cured coating obtained from a resin composition comprising the polymeric compound has good adhesiveness to a substrate, heat resistance, electric insulation and strength.

Japanese Patent Application Laid-Open No. 2008-184571 discloses a polymeric compound having a silphenylene skeleton which has repeating units represented by the following formula and the photo-curable resin composition comprising the polymeric compound.

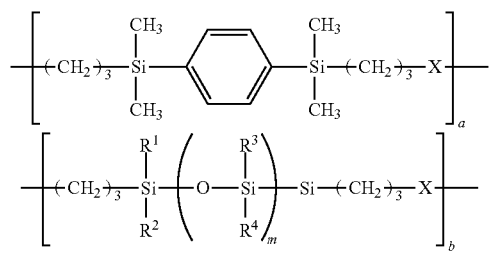

wherein $R^1$ to $R^4$ are, independently of each other, a monovalent hydrocarbon group having 1 to 8 carbon atoms, m is an integer of 1 to 100, a is a positive number, b is 0 or a positive number, and a/(a+b) is not less than 0.5, but not larger than 1.0. X is a divalent organic group represented by the following formula.

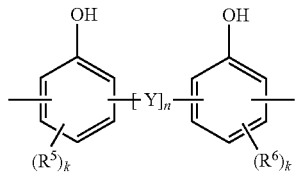

Japanese Patent Application Laid-Open No. 2008-184571 further describes that the photo-curable composition comprising the polymeric compound forms a coating which has various good film properties and reliability as a protective layer.

A wire bonding method with metallic thin lines has been applied to connect a semiconductor chip and a substrate. However, semiconductor devices require high density and high integration, so that a flip-chip mounting method is being mainly used, where conductive projection called bump is formed on the semiconductor chip to directly connect an electrode on a substrate and the bump on the semiconductor chip. In the flip-chip mounting method, interstices between the semiconductor chip and the circuit substrate are sealed with an underfill material in order to improve the strength of the interface and reliability of the semiconductor device. A capillary underfill method is generally applied for the sealing with an underfill material. Japanese Patent Application Laid-Open No. 2007-217708 describes that the capillary underfill method where the underfill material is applied on the one side or plural faces of the chip to allow the underfill material to flow into interstices between a circuit substitute and a chip through a capillary phenomenon to fill there.

The capillary underfill method requires the steps (a) to (g) shown in FIG. 9. The steps will be explained below.

Step (a): A flux material (21) is applied on a circuit substrate (20).

Step (b): A semiconductor chip (22) provided with bumps (22a) is mounted on the circuit substrate (20).

Step (c): The semiconductor chip (22) is bonded to the circuit substrate (20) via the flux materials (21) to form bonding parts (23).

Step (d): The flux materials (21) are washed off.

Step (e): An underfill material (24) is applied on one side or plural faces of the semiconductor chip (22).

Step (f): The underfill material (24) is allowed to flow into interstices between the circuit substrate (20) and the semiconductor chip (22) through capillary phenomenon.

Step (g): The filled underfill material (24) is cured to encapsulate the semiconductor device.

As described above and shown in FIG. 9, the capillary underfill method comprises complicated steps and requires treatment of the wastewater from the washing. Further, the step (f) relies on the capillary phenomenon, so that the time for filling the material is long and, therefore, problems occurred sometimes in the productivity of a semiconductor device.

To solve the problems, Japanese Patent Application Laid-Open No. 2009-239138 discloses a method where a film having an adhesive layer of a resin composition comprising a cross-linkable resin, a compound having flux activity and a film-forming resin is applied on a functional face of a semiconductor chip. In this method, the film for a semiconductor device works as a flux and an encapsulating material, so that the semiconductor chip can be bonded to the circuit substrate without any flux material. Therefore, the aforesaid steps (a), (d), (e) and (f) are unnecessary, whereby the productivity for semiconductor devices is improved.

PRIOR LITERATURES

Patent Literatures

[Patent Literature 1] Japanese Patent No. 3944734
[Patent Literature 2] Japanese Patent Application Laid-Open No. 2008-184571
[Patent Literature 3] Japanese Patent Application Laid-Open No. 2007-217708
[Patent Literature 4] Japanese Patent Application Laid-Open No. 2009-239138

DISCLOSURE OF THE INVENTION

Problems to be Solved by the Invention

However, because the acrylic resin in particular such containing acrylonitrile as a film-forming resin is used the method described in Japanese Patent Application Laid-Open No. 2009-239138, there is a serious problem that insulation reliability, i.e. migration resistance, under the high temperature and high humidity conditions is poor. Thus, the method described in Japanese Patent Application Laid-Open No. 2009-239138 cannot sufficiently improve adhesiveness between the semiconductor chip and the circuit substrate and the reliability of the semiconductor device. Therefore, it is desired to develop an adhesive composition which has good adhesiveness to a substrate and is cured to provide a semiconductor device having good connection and insulation reliability.

One of the objects of the present invention is to provide a novel polymer which can be used suitably as a resin material for semiconductor devices and electronic part. Additionally, another object of the present invention is to provide an adhesive composition which has good adhesiveness to a substrate and can provide a cured product having good insulation reliability, i.e. migration resistance, and connection reliability under high temperature and high humidity conditions.

Means to Solve the Problems

The present inventors have made research and found a novel polymer having siloxane and silphenylene structures and a method of preparing the polymer. Thus, one aspect of the present invention is a polymer having repeating units represented by the following formulas (1-1), (1-2) and (1-3) and weight-average molecular weight of from 3,000 to 500,000, as determined by GPC using tetrahydrofuran as a solvent, reduced to polystyrene:

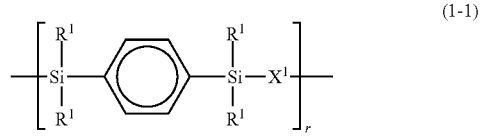
(1-1)

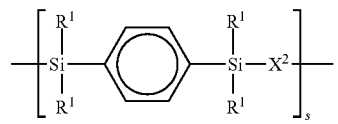
(1-2)

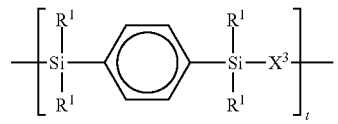
(1-3)

wherein r, s and t are positive integers, the terminal silicon atom in the each of the repeating units represented by the formulas (1-1), (1-2) and (1-3) bonds to the terminal carbon atom in $X^1$, $X^2$ or $X^3$ in the same or different unit, and $R^1$ is, independently of each other, a monovalent hydrocarbon group having 1 to 8 carbon atoms;

$X^1$ is, independently of each other, a divalent group represented by the following formula (2),

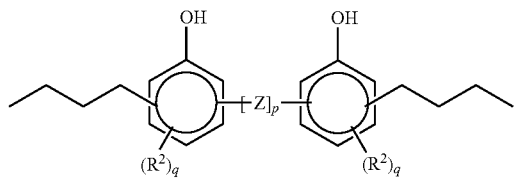
(2)

wherein Z is a substituted or unsubstituted divalent hydrocarbon group having 1 to 15 carbon atoms, p is 0 or 1, $R^2$ is, independently of each other, an alkyl or alkoxy group having 1 to 4 carbon atoms and q is 0, 1 or 2;

$X^2$ is, independently of each other, a divalent group represented by the following formula (3),

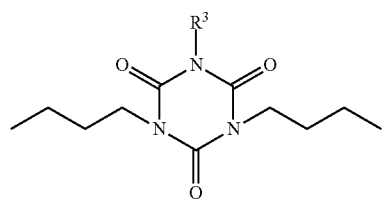
(3)

wherein $R^3$ is, independently of each other, a hydrogen atom, a monovalent hydrocarbon group having 1 to 8 carbon atoms or a glycidyl group;

$X^3$ is, independently of each other, a divalent group represented by the following formula (4),

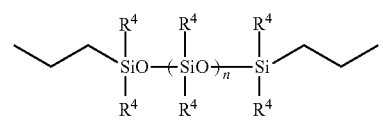
(4)

wherein $R^4$ is, independently of each other, a monovalent hydrocarbon group having 1 to 8 carbon atoms and n is an integer of from 0 to 100.

Further, the present inventors have found that an adhesive composition comprising the afore-mentioned polymer forms an adhesive layer having good flexibility and provides a cured product which does not cause migration even under high temperature and high humidity conditions and has good insulation reliability.

Thus, another aspect of the present invention provides an adhesive composition comprising the following components (A), (B) and (C).

(A) a polymer having repeating units represented by the following formulas (1-1), (1-2) and (1-3) and weight-average molecular weight of from 3,000 to 500,000, as determined by GPC using tetrahydrofuran as a solvent, reduced to polystyrene:

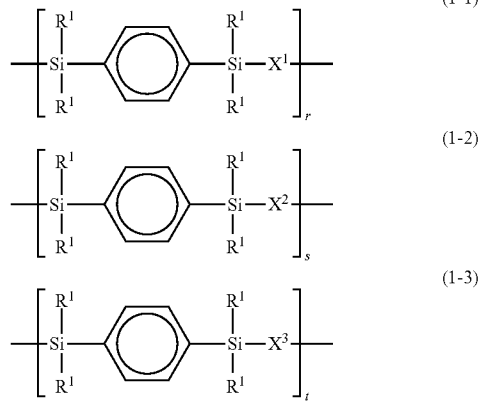

wherein r, s and t are positive integers, the terminal silicon atom in the each of the repeating units represented by the formulas (1-1), (1-2) and (1-3) bonds to the terminal carbon atom in $X^1$, $X^2$ or $X^3$ in the same or different unit, and $R^1$ is, independently of each other, a monovalent hydrocarbon group having 1 to 8 carbon atoms;

$X^1$ is, independently of each other, a divalent group represented by the following formula (2),

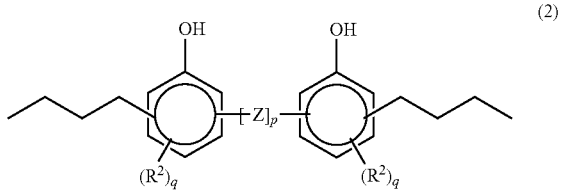

wherein Z is a substituted or unsubstituted divalent hydrocarbon group having 1 to 15 carbon atoms, p is 0 or 1, $R^2$ is, independently of each other, an alkyl or alkoxy group having 1 to 4 carbon atoms and q is 0, 1 or 2;

$X^2$ is, independently of each other, a divalent group represented by the following formula (3),

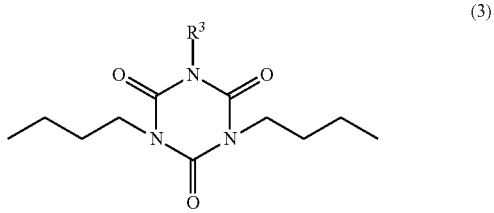

wherein $R^3$ is, independently of each other, a hydrogen atom, a monovalent hydrocarbon group having 1 to 8 carbon atoms or a glycidyl group;

$X^3$ is, independently of each other, a divalent group represented by the following formula (4),

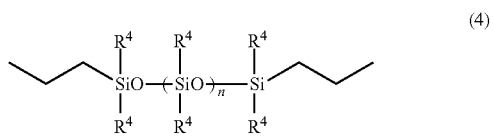

wherein $R^4$ is, independently of each other, a monovalent hydrocarbon group having 1 to 8 carbon atoms and n is an integer of from 0 to 100, (B) a thermosetting resin, and (C) a compound having flux activity.

Further, the present invention provides an adhesive sheet having an adhesive layer made of the adhesive composition, a protective material for a semiconductor device, which has the adhesive layer, and a semiconductor device having a cured product obtained from the adhesive composition.

Effects of the Invention

The present invention provides a novel polymer having siloxane and silphenylene structures. The polymer can be used suitably as a resin material for semiconductor devices and electronic parts. Further, the present adhesive composition comprises the polymer having the aforesaid repeating units and, thereby, forms an adhesive layer having good flexibility. The adhesive composition comprising the polymer having the aforesaid repeating units does not cause a problem of migration under high temperature and high humidity conditions and provides a cures product having good insulation reliability. Therefore, the present adhesive composition can be used suitably as an adhesive layer for adhesive sheets and a protective material for semiconductor devices to provide semiconductor devices having good insulation reliability.

The present adhesive composition comprises the compound having flux activity and, thereby, forms an adhesive layer having effect to reduce and remove a metal oxide membrane upon heating, called "flux activity". Therefore, a semiconductor device having good connection reliability is provided. Additionally, when the semiconductor chip and a circuit substrate are connected, the adhesive layer works as a flux, whereby a step where the flux material is applied on the substrate (step (a) in FIG. 9), a step where the flux are washed off (step (d) in FIG. 8), a step where an underfill material is applied on one side or plural faces of the semiconductor chip (step (e) in FIG. 9), and a step where the underfill material is allowed to flow into interstices between the substrate and the semiconductor chip through capillary phenomenon (step (f) in FIG. 9) are unnecessary, whereby the productivity of a semiconductor device is improved.

BRIEF DESCRIPTION ON THE DRAWINGS

BEST MODES OF THE INVENTION

Figure 1:
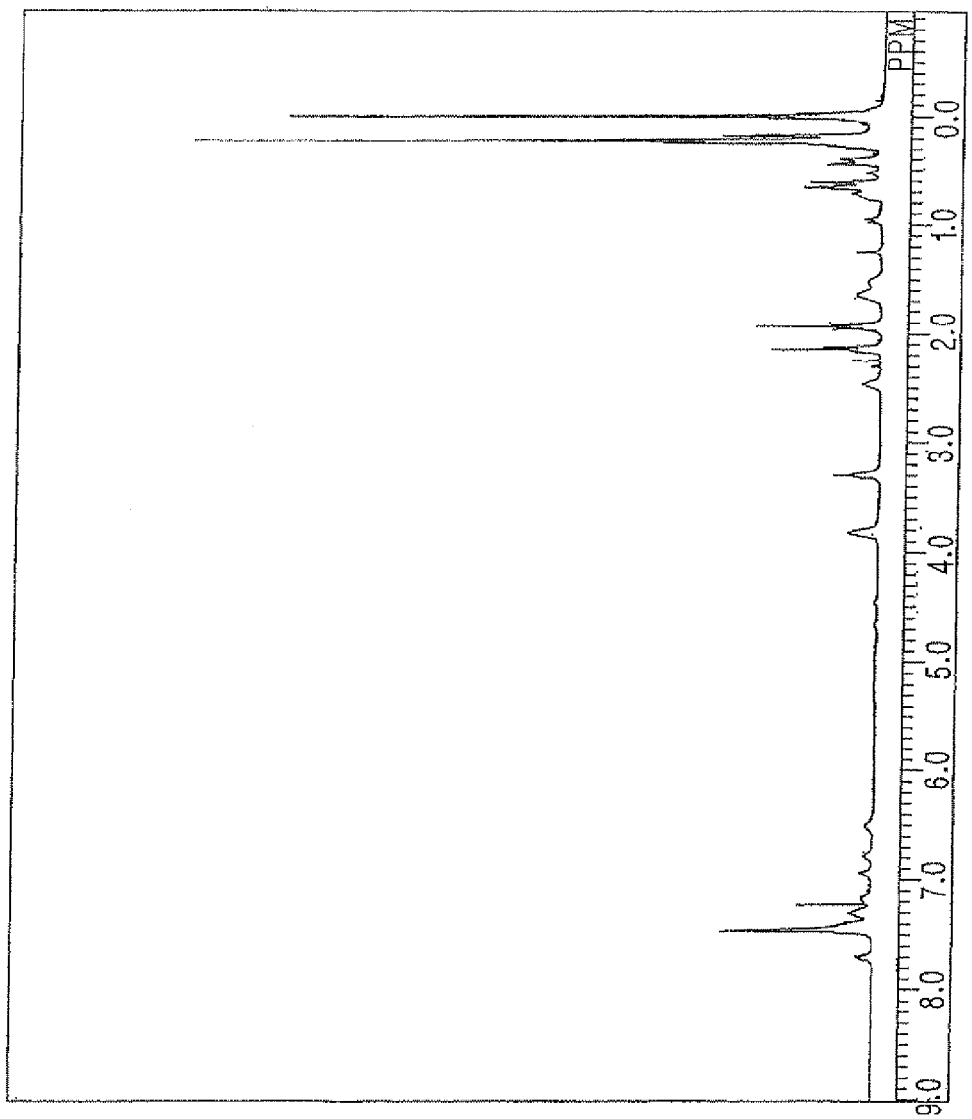
FIG. 1 is a chart of $^1$H-NMR spectra of the polymer prepared in Example 1.

One aspect of the present invention is a polymer which has repeating units represented by the afore-mentioned formulas (1-1), (1-2) and (1-3) and weight-average molecular weight of from 3,000 to 500,000, preferably from 5,000 to 200,000, as determined by GPC using tetrahydrofuran as a solvent, reduced to polystyrene. In the formulas (1-1), (1-2) and (1-3), r, s and t are the number of each of the repeating units represented by the formulas (1-1), (1-2) and (1-3). r, s and t are, independently of each other, a positive integers and such a number that the weight-average molecular weight of the polymer is from 3,000 to 500,000, preferably from 5,000 to 200,000, and further preferably r/(r+s+t) is not less than 0.05 but not more than 0.8, s/(r+s+t) is not less than 0.1 but not more than 0.7 and t/(r+s+t) is not less than 0.05 but not more than 0.8, further preferably r/(r+s+t) is not less than 0.1 but not more than 0.6, s/(r+s+t) is not less than 0.2 but not more than 0.5 and t/(r+s+t) is not less than 0.1 but not more than 0.7. The terminal silicon atom in each of the repeating units represented by the formulas (1-1), (1-2) and (1-3) bonds to the terminal carbon atom in $X^1$, $X^2$ or $X^3$ in the same or different unit. The units may be bonded to each other at random or to form a block polymer.

In the aforesaid formula, $R^1$ is, independently of each other, a monovalent hydrocarbon group having 1 to 8, preferably 1 to 6 carbon atoms. Examples of $R^1$ include methyl, ethyl, propyl, hexyl, cyclohexyl and phenyl groups, among which methyl and phenyl groups are preferred because of good availability of their raw materials.

In the formula (2), $R^2$ is, independently of each other, alkyl or alkoxy groups having 1 to 4, preferably 1 to 2 carbon atoms. Examples of $R^2$ include methyl, ethyl, propyl, tert-butyl, methoxy and ethoxy groups. q is 0, 1 or 2, preferably 0.

In the formula (2), Z is a substituted or unsubstituted divalent hydrocarbon group having 1 to 15 carbon atoms, and apart or whole of their hydrogen atoms each bonded to a carbon atom may be replaced with a halogen atom (s), such as fluorine, bromine and chlorine atoms. Z is preferably a divalent group selected from the groups described below. p is 0 or 1.

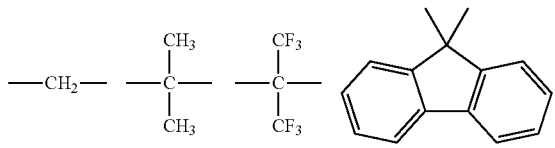

In the formula (3), $R^3$ is hydrogen atom, a monovalent hydrocarbon groups having 1 to 8, preferably 1 to 3 carbon atoms, or a glycidyl group. Examples of the monovalent hydrocarbon group include methyl, ethyl, propyl and cyclohexyl groups.

In the formula (4), $R^4$ is, independently of each other, a monovalent hydrocarbon groups having 1 to 8, preferably 1 to 6 carbon atoms. Examples of $R^4$ include methyl, ethyl, propyl, hexyl, cyclohexyl and phenyl groups, among which methyl and phenyl groups are preferred because of good availability of raw materials. n is an integer of from 0 to 100, preferably from 0 to 60.

The polymer having the repeating units represented by the formulas (1-1), (1-2) and (1-3) is represented by the following general formula.

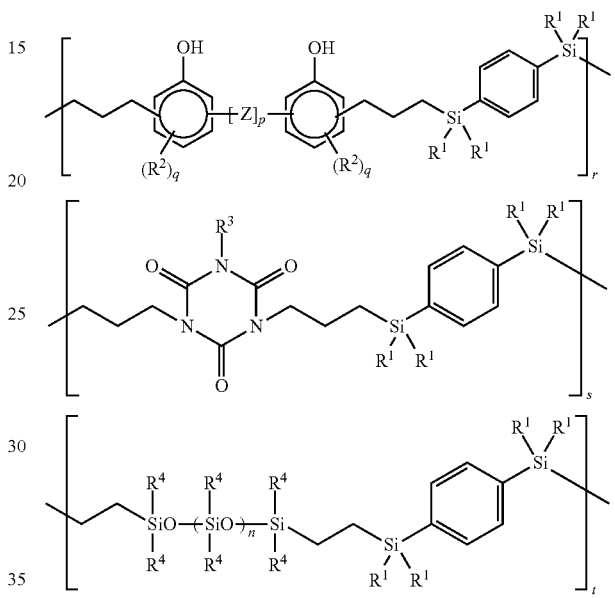

wherein $R^1$, $R^2$, $R^3$, $R^4$, Z, n, p, q, r, s and t are as defined above. The terminal silicon atom in the repeating units bonds to the terminal carbon atom in the same or different unit. The terminal of the polymer is an aliphatic unsaturated group or a hydrogen atom bonded to a silicon atom.

The present invention further provide a polymer which has repeating units represented by the formulas (1-1), (1-2) and (1-3) and at least one selected from the group consisting of units represented by the following formula (5), (6) or (7).

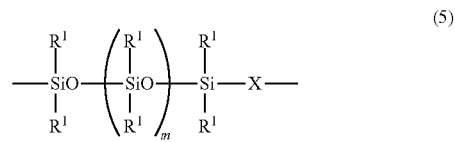

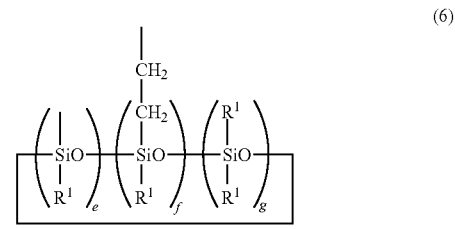

-continued

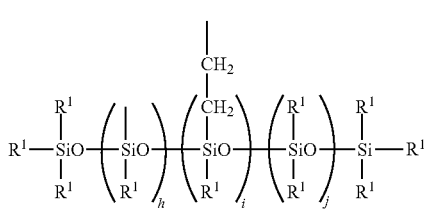
(7)

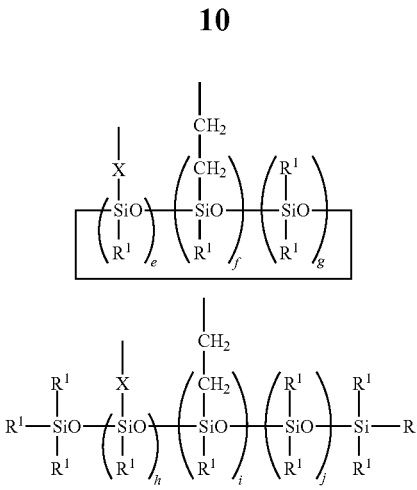

The terminal silicon atom in the repeating units represented by the formulas (1-1), (1-2) and (1-3) and in the units represented by the formulas (5), (6) and (7) bonds to the terminal carbon atom in the same or different unit. The units may be bonded to each other at random or to form a block polymer. In the formula (5), X is, independently of each other, the group represented by the $X^1$, $X^2$ or $X^3$, m is an integer of from 0 to 100, preferably from 1 to 60. In the formulas (6) and (7), e, f, g, h, i and j are integers of from 0 to 100, preferably from 0 to 30, provided that e+f+g is not less than 3, e and f are not simultaneously zero and h and i are not simultaneously zero. In the formulas (5), (6) and (7), $R^1$ is as defined above.

The present polymer is composed of at least 5 mole % and at most 80 mole %, preferably at least 10 mole % and at most 60 mole %, of the group represented by $X^1$, i.e. the formula (2), at least 10 mole % and at most 70 mole %, preferably at least 20 mole % and at most 50 mole %, of the group represented by $X^2$, i.e. the formula (3) and at least 5 mole % and at most 80 mole %, preferably at least 10 mole % and at most 70 mole %, of the group represented by $X^3$, i.e. the formula (4), based on a total mole amount of the groups represented by $X^1$, $X^2$ and $X^3$.

The present polymer may comprise at least one type of the units selected from the group consisting of the units represented by the formulas (5), (6) and (7). The number of repetition of the unit is such that the weight-average molecular weight of the polymer is from 3,000 to 500,000, preferably from 5,000 to 200,000, as determined by GPC using tetrahydrofuran as a solvent, reduced to polystyrene. Where a sum of the number of the repetition of the units represented by the formulas (1-1), (1-2) and (1-3), r+s+t, is abbreviated as "a" which is a positive number, the number of the repetition of the unit represented by the formula (5) is abbreviated as "b", the number of the repetition of the unit represented by the formula (6) is abbreviated as "c" and the number of the repetition of the unit represented by the formula (7) is abbreviated as "d" where b, c and d are integer numbers, then it is preferred that "a" is such that a/(a+b+c+d) is not less than 0.05 and not larger than 0.9, preferably not less than 0.2 and not larger than 0.98. When the polymer has the unit represented by formula (5), "b" is such that b/(a+b+c+d) is not less than 0.01 and not larger than 0.95, preferably not less than 0.05 and not larger than 0.8. When the polymer has the unit represented by formula (6), "c" is such that c/(a+b+c+d) is not less than 0.01 and not larger than 0.8, preferably not less than 0.05 and not larger than 0.5. When the polymer has the unit represented by formula (7), "d" is such that d/(a+b+c+d) is not less than 0.01 and not larger than 0.8, preferably not less than 0.01 and not larger than 0.5.

The present polymer may further comprise the units represented by the following formulas, in addition to the aforesaid units.

wherein $R^1$, X, e, f, g, h, i and j are as defined above. The terminal carbon atom in the units bonds to the terminal silicon atom in the unit represented by the formula (1-1), (1-2), (1-3), (5), (6) or (7).

For instance, the polymer which has the repeating units represented by the formulas (1-1), (1-2) and (1-3) and the unit represented by the formula (5) is represented by the following formula.

wherein $R^1$, $R^2$, $R^3$, $R^9$, Z, n, m, p, q, r, s, t and b are as defined above. The terminal silicon atom in the repeating units bonds to the terminal carbon atom in the same or different unit. The terminal of the polymer is an aliphatic unsaturated group or a hydrogen atom bonded to a silicon atom.

For instance, the polymer which has the repeating units represented by the formulas (1-1), (1-2) and (1-3) and the unit represented by the formula (6) is represented by the following formula.

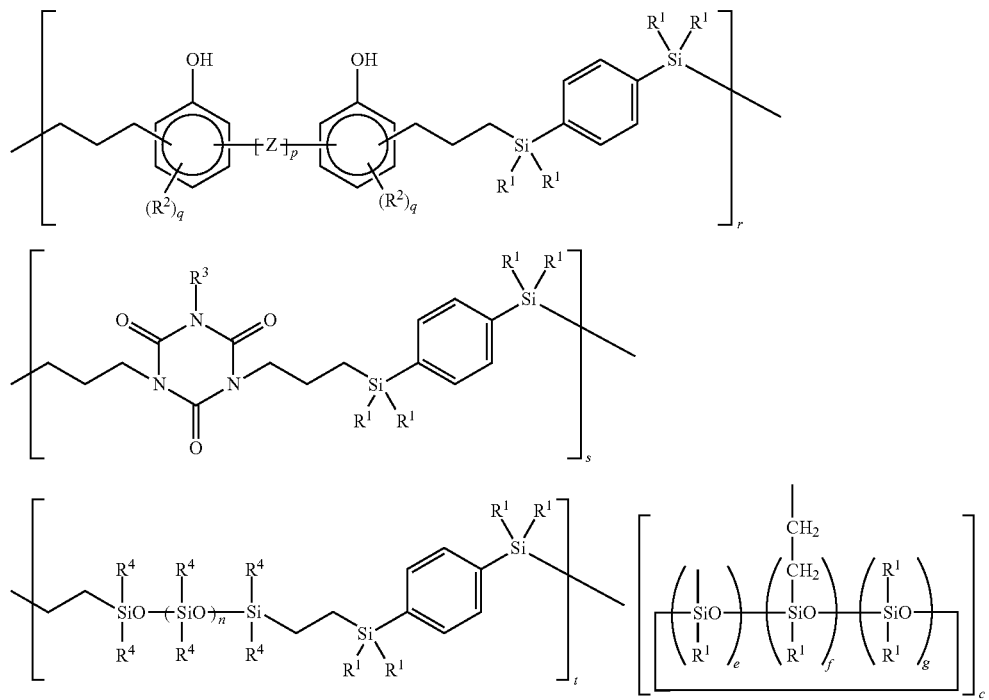

wherein $R^1$, $R^2$, $R^3$, $R^4$, Z, n, p, q, e, f, g, r, s, t and c areas defined above. The terminal silicon atom in the repeating units bonds to the terminal carbon atom in the same or different unit. The terminal of the polymer is an aliphatic unsaturated group or a hydrogen atom bonded to a silicon atom.

For instance, the polymer which has the repeating units represented by the formulas (1-1), (1-2) and (1-3) and the unit represented by the formula (7) is represented by the following formula.

wherein $R^1$, $R^2$, $R^3$, $R^4$, Z, n, p, q, h, i, j, r, s, t and d are as defined above. The terminal silicon atom in the repeating units bonds to the terminal carbon atom in the same or different unit. The terminal of the polymer is an aliphatic unsaturated group or a hydrogen atom bonded to a silicon atom.

The one aspect of the present invention further provides a method of preparing the afore-mentioned polymer.

The polymer composed of the repeating units represented by the formulas (1-1), (1-2) and (1-3) is prepared in a method

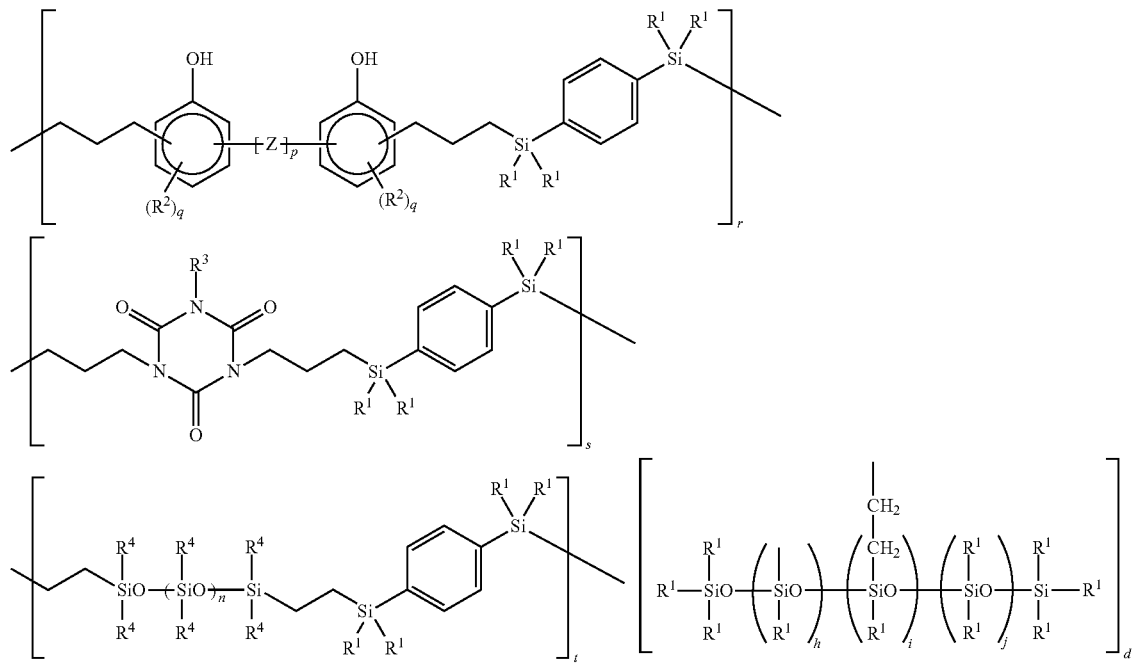

comprising a step where a compound represented by the following formula (8), a compound represented by the following formula (9), a compound represented by the following formula (10) and a compound represented by the following formula (11) are subjected to an addition reaction in the presence of a metal catalyst.

(8)
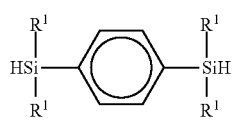

wherein $R^1$ is as defined above.

(9)
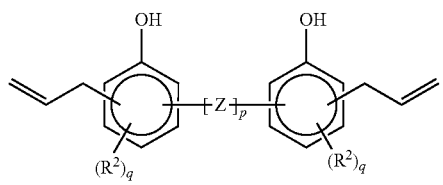

wherein Z, $R^2$, p and q are as defined above.

(10)
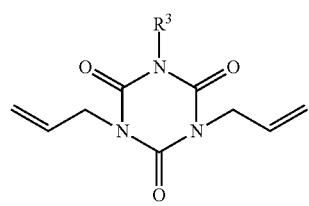

wherein $R^3$ is as defined above.

(11)
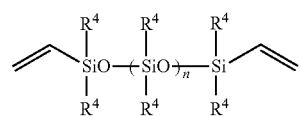

wherein $R^4$ and n are as defined above.

Examples of the compound represented by the formula (11) include the following compounds.

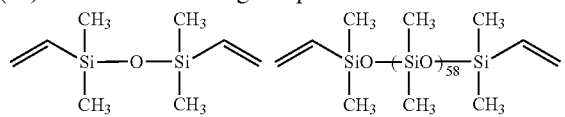

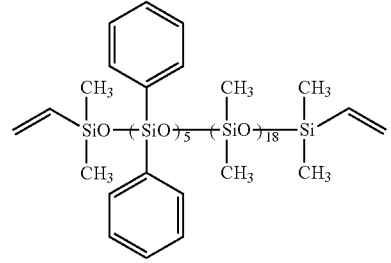

The present invention further provide a method comprising a step where a compound represented by the formula (8), a compound represented by the formula (9), a compound represented by the formula (10), a compound represented by the formula (11) and at least one compound selected from the group consisting of compounds represented by the following formulas (12), (13) and (14) are subjected to an addition reaction in the presence of a metal catalyst. According to this method, the polymer comprising the repeating units represented by the formulas (1-1), (1-2) and (1-3) and at least one unit selected from the group consisting of the units represented by the formula (5), (6) or (7).

(12)
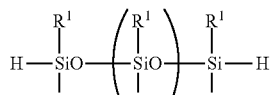

(13)
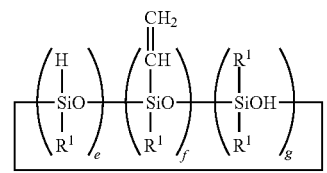

(14)
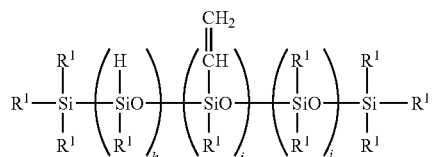

wherein $R^1$, m, e, f, g, h, i and j are as defined above.

Examples of the compound represented by the formula (13) include the following compounds.

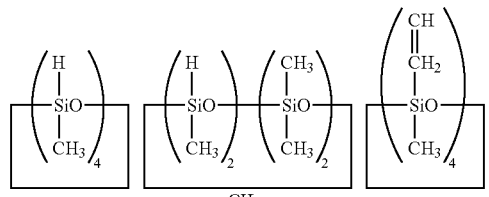

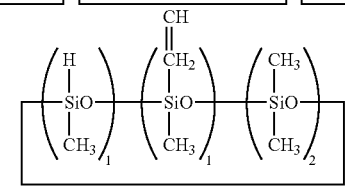

Examples of the compound represented by the formula (14) include the following compounds.

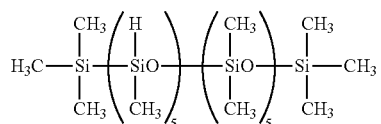

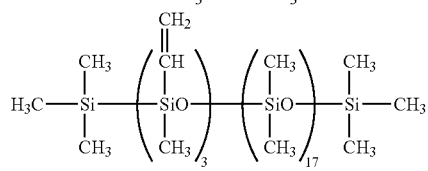

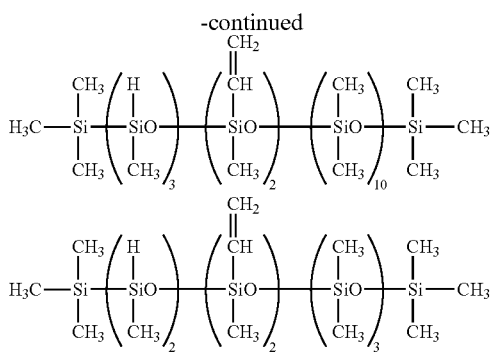

Examples of the metal catalyst include platinum group metals such as platinum which include platinum black, rhodium and palladium; platinum chloride, chloroplatinic acid and chloroplatinate such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot H_2O$, $PtCl_2$, $Na_2HPtCl_4 \cdot xH_2O$, wherein x is preferably an integer of from 0 to 6, further preferably 0 or 6; alcohol-modified chloroplatinic acids such as that described in U.S. Pat. No. 3,220,972, a complex of chloroplatinic acid with olefin such as that described in U.S. Pat. No. 3,159,601, U.S. Pat. No. 3,159,662 and U.S. Pat. No. 3,775,452; those where a platinum group metal such as platinum black or palladium is supported on a carrier such as alumina, silica or carbon; complexes rhodium with olefin; chlorotris (triphenylphosphine) rhodium, so-called Wilkinson's catalyst; and complexes of platinum chloride, chloroplatinic acid or chloroplatinate with siloxane having a vinyl group, in particular cyclosiloxane having a vinyl group.

An amount of the catalyst to be used may be a catalytic amount, such as 0.0001 to 0.1 mass %, preferably from 0.001 to 0.01 mass %, of a platinum group metal, based on total mass of the raw materials subjected to the reaction. The addition reaction can be performed even without a solvent, but may be performed with a solvent, if necessary. Example of the solvent is preferably a hydrocarbon solvent such as toluene and xylene. A reaction temperature may be such that the catalyst is not deactivated and the reaction can be finished in a short time, for instance, temperatures of from 40 to 150 degrees C., in particular from 60 to 120 degrees C. A reaction time may be selected, depending on a species and amount of the polymer to be prepared, such as 0.5 to 100 hours, in particular 0.5 to 30 hours. When a solvent is used, the solvent is removed by vacuum distillation after the reaction.

A method for the reaction is not limited to any particular one. For instance, in a case where the compounds represented by the formulas (8), (9), (10) and (11) are reacted, the compounds represented by the formulas (9), (10) and (11) are first mixed and heated, a metal catalyst is added to the mixture to which the compound represented by the formula (8) is then added dropwise over 0.1 to 5 hours. In a case where the compound represented by the formula (12) is reacted, it is better to add dropwise the compound represented by the formula (8) and the compound represented by the formula (12) over 0.1 to 5 hours separately or together, or if needed, as their mixture.

In a case where the compound represented by the formulas (13) and (14) are reacted, the compounds represented by the formulas (8), (9), (10) and (11) and, if needed, the compound represented by the formula (12) are first subjected to an addition reaction with stirring for 0.5 to 100 hours, in particular 0.5 to 30 hours. Then, the compound represented by the formula (13) or (14) is added dropwise over 0.1 to 5 hours to the reaction mixture and stirred for 1 to 10 hours, in particular 2 to 5 hours. If the compounds represented by the formulas (8) to (12) and the compounds represented by the formulas (13) or (14) are reacted at the same time, it is likely that the reaction product gets gelled.

The ratio among the compounds is such amount that a total mole of the hydrosilyl group contained in the compounds represented by the formulas (8), (12), (13) and (14) is 0.67 to 1.67, preferably 0.83 to 1.25, relative to a total mole of the alkenyl group contained in the compounds represented by the formulas (9), (10), (11), (13) and (14). The weight-average molecular weight of the polymer can be controlled by a molecular weight modifier such as a monoallyl compound such as o-allylphenol, a monohydrosilane such as trihydrosilane or a monohydrosiloxane.

The present polymer can be used suitably for a resin material for semiconductor devices or electronic parts. A method of preparing a resin material with the present polymer is not limited to any particular one, and may be a conventional manner. Examples of the application in resin materials include an encapsulating agent or adhesive for the production of semiconductor devices; protective membrane materials on surfaces of electronic parts such as diodes, transistors, ICs and LSIs, for instance, junction coatings, passivation coatings and buffer coatings on surface of semiconductor elements; alpha ray blocking coatings for LSIs; interlayer insulators for multilayer wirings; conformal coatings for printed circuit boards; ion implantation masks; and surface protection films for solar cells.

The another aspect of the present invention provides an adhesive composition comprising (A) the aforesaid polymer which has the repeating units represented by the formulas (1-1), (1-2) and (1-3) and weight-average molecular weight of from 3,000 to 500,000, as determined by GPC using tetrahydrofuran as a solvent, reduced to polystyrene, (B) a thermosetting resin and (C) a compound having flux activity. Further, the present invention provides an adhesive sheet having an adhesive layer made of the adhesive composition, a protective material for a semiconductor device, which has the adhesive layer, and a semiconductor device having a cured product obtained from the adhesive composition. In the present invention, the component (A) works as a film-forming resin.

(B) Thermosetting Resin

The component (B) is contained to improve the adhesiveness and connection reliability of the adhesive composition. The thermosetting resin is not limited to particular ones, and may be epoxy resins, phenol resins, melamine resins, urethane resins and polyester resins, among which the epoxy resins are preferred. The epoxy resin can react with a phenolic hydroxyl group in the polymer (A) to form cross-linked structure. Therefore, when the thermosetting resin is an epoxy resin, the thermosetting resin and polymer (A) are react to form cross-linked structure in the curing of the adhesive composition, so that the adhesiveness of the adhesive layer and connection reliability of the cured product is further improved.

Examples of the epoxy resin include glycidyl ether type epoxy resins such as bisphenol A epoxy resins, bisphenol F epoxy resins, or hydrogenated ones therefrom, phenol novolak epoxy resins, and cresol novolak epoxy resins; glycidyl ester type epoxy resins such as glycidyl ester of hexahydrophthalic acid and glycidyl ester of dimer acid; and glycidyl amine type epoxy resins such as triglycidyl isocyanulate and tetraglycidyl diaminodiphenyl methane. Preferred are bisphenol A epoxy resins, bisphenol F epoxy resins, phenol novolak epoxy resins and cresol novolak epoxy resins. Commercially available examples of such epoxy resins include jER1001, ex Mitsubishi Chemical Corporation, epiclon-830S, ex DIC Corporation, jER517, ex Mitsubishi Chemical Corporation, and EOCN103S, ex Nippon Kayaku Co., Ltd.

The thermosetting resin may be a phenol resin. Examples of the phenol resin include alkylphenols such as phenol, bisphenol A, p-t-butylphenol, octylphenol and p-cumylphenol; cresol type phenol resins and/or novolak type phenol resins which are prepared from p-phenyl phenol or cresol. One, two or more of the thermosetting resin may be used.

The amount of the thermosetting resin is not limited, but is preferably 5 to 500 parts by mass, more preferably 10 to 410 parts bymass, relative to 100 parts bymass of the component (A). Where the amount of the thermosetting resin is in the aforesaid range, the adhesiveness of the adhesive composition or the adhesive layer to a substrate when pressure bonded improves. Additionally, the cured product obtained from the adhesive composition has good connection reliability.

The present adhesive composition preferably further comprises an epoxy resin curing agent and/or an epoxy resin curing accelerator, in additional to the epoxy resin. When the present composition contains an epoxy resin curing agent and/or an epoxy resin curing accelerator, the curing reaction proceeds properly and uniformly. The amount of the epoxy resin curing agent is 3 to 200 parts by mass, preferably 5 to 160 parts by mass, relative to 100 parts by mass of the component (A). The amount of the epoxy resin curing accelerator is 0.1 to 10 parts by mass, preferably 0.5 to 5 parts by mass, relative to 100 parts by mass of the component (A).

The epoxy resin curing agent may be conventional one and may be an aromatic curing agent or an alicyclic curing agent in term of good heat resistance, but not limited to these. Examples of the epoxy resin curing agent include an amine curing agent, an acid anhydride curing agent, boron trifluoride amine and a phenol resin. Examples of the amine curing agent include aliphatic amine curing agents such as diethylenetriamine, triethylenetetramine and tetraethylene pentamine; alicyclic amine curing agents such as isophorone diamine; aromatic amine curing agents such as diaminodiphenylmethane and phenylenediamine; and dicyan diamide. Among these, the aromatic amine curing agents are preferred. Examples of the acid anhydride curing agent include phthalic anhydride, pyromellitic anhydride, trimellitic anhydride and hexahydrophthalic anhydride. One, two or more of the epoxy resin curing agents may be used.

Examples of the epoxy resin curing accelerator include imidazole compounds such as 2-methylimidazole, 2-ethylimidazole, 2-ethyl-4-methylimidazole and ethyl isocyanate compounds thereof, 2-phenylimidazole, 2-phenyl-4-methylimidazole, 2-phenyl-4-methyl-5-hydroxymethyl imidazole, and 2-phenyl-4,5-dihydroxymethyl imidazole; DBU type compounds such as 1,8-diazabicyclo[5.4.0]undecene-7 (DBU), 1,5-diazabicyclo[4.3.0]nonene-5(DBN), organic salts of DBU, phenolic resin salts of DBU, and tetraphenylborate salts of DBU derivative; triorgano phosphines such as triphenylphosphine, tributylphosphine, tris(p-methoxyphenyl)phosphine, tris(p-methoxyphenyl)phosphine, tris(p-ethoxyphenyl)phosphine, triphenylphosphine-triphenylborate and tetraphenylphosphine-tetraphenylborate; and tertiary amines such as quaternary phosphonium salts and triethyleneammonium-triphenylborate and tetraphenylborate salts thereof. One, two or more of the epoxy resin curing accelerator may be used.

(C) Compound Having Flux Activity

The compound having flux activity (C) is a compound which has an effect to reduce and remove a metal oxide membrane upon heating, called "flux activity", and is not limited to any particular ones. Examples of the compounds include activated rosins, organic acids having a carboxyl group, amines, phenols, alcohol and azines.

In particular, the compound having flux activity is preferably a compound having a carboxyl group or phenolic hydroxyl group in the molecule. The compound having flux activity may be liquid or solid. When the compound having flux activity has a carboxyl group or phenolic hydroxyl group, the effect to remove a metal oxide membrane of a bump on a functional face upon heating is further increased in soldering the functional face of a semiconductor chip having the adhesive composition.

Examples of the compound having a carboxyl group include aliphatic acid anhydrides, alicyclic anhydrides, aromatic anhydrides, aliphatic carboxylic acids and aromatic carboxylic acids. Examples of the compound having a phenolic hydroxyl group include phenols.

Examples of the aliphatic anhydrides include succinic anhydride, polyadipic anhydride, polyazelaic anhydride and polysebacic anhydride.

Examples of the alicyclic anhydrides include methyltetrahydro phtalic anhydride, methylhexahydro phtalic anhydride, methyl himic anhydride, hexahydro phthalic anhydride, tetrahydro phthalic anhydride, trialkyltetrahydro phthalic anhydride and methylcyclohexene dicarboxylic anhydride.

Examples of the aromatic anhydrides include phtalic anhydride, trimellitic anhydride, pyromellitic anhydride, benzophenone tetracarboxylic anhydride, ethylene glycol bistrimellitate and glycerol tristrimellitate.

Examples of the aliphatic carboxylic acids include glutaric acid, adipic acid, pimelic acid and sebacic acid. The other examples of aliphatic carboxylic acids include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid and succinic acid.

Examples of the aromatic carboxylic acids include benzoic acid, phthalic acid, isophthalic acid, terephthalic acid, hemimellitic acid, trimellitic acid, trimesic acid, mellophanic acid, prehnitic acid, pyromellitic acid, mellitic acid, toluic acid, xylic acid, hemellitic acid, mesitylene acid, prehnitylic acid, toluic acid, cinnamic acid, salicylic acid, 2,3-dihydroxybenzoate, 2,4-dihydroxybenzoate, gentisic acid (or 2,5-dihydroxybenzoate), 2,6-dihydroxybenzoate, 3,5-dihydroxybenzoate, gallic acid (or 3,4,5-tyihydroxybenzoate), naphthoic acid derivatives such as 1,4-dihydroxy-2-naphthoate and 3,5-dihydroxy-2-naphthoate, and diphenolic acid.

Examples of the compound having a phenolic hydroxyl group include phenol, o-cresol, 2,6-xylenol, p-cresol, m-cresol, o-ethylphenol, 2,4-xylenol, 2,5-xylenol, m-ethylphenol, 2,3-xylenol, meditol, 3,5-xylenol, p-tert-butylphenol, catechol, p-tert-amylphenol, resorcinol, p-octylphenol, p-phenylphenol, bisphenol A, bisphenol F, bisphenol AF, biphenol, diallyl bisphenol F, diallyl bisphenol A, trisphenol and tetrakis phenol and a monomers having a phenolic hydroxyl group such as phenolphthalein.

The compound having flux activity (C) preferably can cross-link react with the components (A) or (B). Then, the compound having flux activity is incorporated into the three-dimensional cross-link structure via the reaction with the components (A) and (B). The component (C) is preferably a resin curing agent having flux activity. Examples of the curing agent having flux activity include compounds which have at least two phenolic hydroxyl groups and at least one carboxyl group bonded directly to an aromatic group, such as for instance, benzoic acid derivatives such as 2,3-dihydroxybenzoate, 2,4-dihydroxybenzoate, gentisic acid (or 2,5-dihydroxybenzoate), 2,6-dihydroxybenzoate, 3,4-dihydroxybenzoate and gallic acid (or 3,4,5-trihydroxybenzoate); naphthoic acid derivatives such as 1,4-dihydroxy-2-naphthoate; 3,5-dihydroxy-2-naphthoate and 3,7-dihydroxy-2-naphthoate; phenolphthalein; and diphenolic acid.

Incorporation of the compound having flux activity into the three-dimensionally cross-linked structure prevents a residue of the compound having flux activity from separating from the three-dimensionally cross-linked structure of the cured product, whereby dendrites originated from the residue of the compound is prevented from growing to improve insulation reliability, i.e. migration resistance, of the cured product.

The amount of the compound having flux activity (C) is not particularly limited, but is preferably 1 to 20 parts by mass, further preferably 2 to 15 parts by mass, relative to total 100 parts by mass of the components (A) and (B). If the amount of the compound having flux activity (C) is smaller than the afore-mentioned lower limit, the effect of the flux activity cannot be obtained sufficiently. If the amount of the compound having flux activity (C) is larger than the afore-mentioned upper limit, the compound having flux activity separates from the cross-linked structure of the cured product after a flip-chip mounting step and the dendrites may thereby grow. When the amount of the compound having flux activity is in the afore-mentioned range an oxide membrane on the surface of metal can be removed sufficiently, so that good bonding with a big strength is attained in soldering.

Other Components

The present adhesive composition may contain other components in as long as the effects of the present invention are not obstructed, in addition to the aforesaid components (A) to (C). Examples of the other components include inorganic fillers and silane coupling agents.

Inorganic Fillers

The present adhesive composition may include the inorganic filler in order to obtain property such as heat resistance, dimensional stability and moisture resistance. Examples of the inorganic filler include silicates such as talc, baked clay, unbaked clay, mica and glass; oxides such as powder of titanium oxide, alumina, molten silica such as molten spherical silica and molten crushed silica, and crystalline silica; carbonates such as calcium carbonate, magnesium carbonate and hydrotalcite; hydroxides such as aluminum hydroxide, magnesium hydroxide and calcium hydroxide; sulfates and subsulfates such as barium sulfate, calcium sulfate and calcium sulfite; borates such as zinc borate, barium metaborate, aluminum borate, calcium borate and sodium borate; nitrides such as aluminum nitride, boron nitride and silicon nitride. One, two or more of the inorganic filler may be used. Among these, silica powder of molten silica and crystalline silica, in particular, molten spherical silica, are preferred.

The incorporation of the inorganic filler in the present composition improves heat resistance, moisture resistance and strength of the present adhesive composition after cured and improves a peeling property of a protective layer from an adhesive layer in an adhesive sheet which comprises an adhesive layer of the present adhesive composition layered with a protective layer. A shape of the inorganic filler is not limited to particular one, but a spherical shape is preferred whereby the adhesive layer does not have anisotropy.

A mean particle size of the inorganic filler is not limited to particular one, but is preferably 0.01 μm or more and 0.5 μm or less, further preferably 0.01 μm or more and 0.3 μm or less. If the mean particle size of the inorganic filler is less than the afore-mentioned lower limit, the inorganic filler tends to aggregate to decrease the strength of the cured product. If the mean particle size of the inorganic filler is larger than the afore-mentioned upper limit, transparency of the adhesive layer deteriorates and, therefore, it is difficult to recognize a mark for alignment present on a surface of a semiconductor chip so as to make it difficult to align the semiconductor chip with the substrate.

The amount of the inorganic filler is not limited to particular one, but is preferably 5 mass % or more and 60 mass % or less, further preferably 10 mass % or more and 50 mass % or less, based on the whole mass of the present adhesive composition. If the amount of the inorganic filler is larger than the afore-mentioned upper limit, the transparency and tackiness of the adhesive layer deteriorate.

Silane Coupling Agent

The present adhesive composition may include a silane coupling agent. The incorporation of the silane coupling agent improves the adhesiveness of the adhesive layer to an adherend. Examples of the silane coupling agent include epoxy silane coupling agents, and amino silane coupling agents having an aromatic group. One, two or more of the silane coupling agent may be used. The amount of the silane coupling agent is not limited to particular one, but is preferably 0.01 mass % or more and 5 mass % or less, based on the whole mass.

The present adhesive composition may contain other components besides the aforesaid components. For instance, various additives may be contained properly in order to increase compatibility of the components (A) with (B) or improve various properties of the adhesive composition, such as storage stability and workability. Examples of the additives include internal release agents such as fatty acid esters, glycerates, zinc stearate and calcium stearate; phenolic, phosphoric or sulfuric antioxidants. These may be added in such an amount that the effects of the present invention are not obstructed. The other optional components may be added in the present adhesive composition without any solvent, but may be solved or dispersed in an organic solvent to prepare a solution or a dispersion and, then added in the present adhesive composition. The organic solvent may be those explained which will be below as a solvent to prepare a dispersion of the adhesive composition.

Preparation of the Adhesive Composition

The present adhesive composition is prepared in a manner where the polymer (A), the thermosetting resin (B), the compound having flux activity (C), and if desired, other optional components, and if desired, an organic solvent, are added separately or at the same time, with heating if needed, solved, and mixed to disperse. Any apparatus can be used, such as a grinding machine equipped with a stirrer and a heater, a three-roll mill, a ball mill, and a planetary mixer. These apparatuses may also be used in appropriate combination. The organic solvent mentioned below can be used as the solvent to prepare the dispersion of the adhesive composition.

The viscosity of the present adhesive composition, as determined at 25 degrees C. ranges preferably from 10 to 3,000 mPa·s, more preferably 100 to 2000 mPa·s. The viscosity is determined with a rotary viscometer.

When the adhesive layer is formed with the present adhesive composition, the adhesive composition is preferably used in a liquid form in an organic solvent. Examples of the organic solvent include N,N-dimethylacetamide, methyl ethyl ketone, N,N-dimethylformamide, cyclohexanone, cyclopentanone, N-methyl-2-pyrrolidone, toluene, methanol, ethanol, isopropanol, acetone, propyleneglycol monomethylether, and propyleneglycol monomethylether acetate, among which methyl ethyl ketone, cyclopentanone, propyleneglycol monomethylether and propyleneglycol monomethylether acetate are preferred. One, two or more of the solvents may be used. The solvent is preferably added in such amount as to give a solid content of 30 to 70 mass %, more preferably 40 to 65 mass %.

Preparation of the Adhesive Sheet

The present invention further provides an adhesive sheet having the adhesive layer formed with the afore-mentioned adhesive composition. Examples of the adhesive sheet include an adhesive sheet which is formed by laminating an adhesive layer of the present adhesive composition on a protective layer, i.e. release substrate, to covering the adhesive layer. An example of the method of preparing the present adhesive sheet will be described below.

The liquid which is obtained by disperse the adhesive composition in the organic solvent is applied on the protective layer, i.e. release substrate, with, for instance, a reverse-roll costar and a comma coater. The protective layer, i.e. release substrate, with the dispersion liquid of the adhesive composition thereon is passed through an inline dryer at 80 to 160 degrees C. for 2 to 20 minutes to remove the organic solvent to dry to form an adhesive layer so that an adhesive sheet having the adhesive layer is obtained. If needed, another protective layer, i.e. release substrate, is pressure bonded to the adhesive layer to laminate with a roll laminator to prepare an adhesive sheet. The thickness of the adhesive layer formed on the adhesive sheet is preferably is 5 to 150 µm, in particular 10 to 100 µm.

The protective layer, i.e. release substrate, for preparing the adhesive sheet may be one which can be peeled from the adhesive layer with keeping a shape of the adhesive layer and is not limited to particular ones. Examples of the protective layer include plastic films which is treated to have a releasing property, such as polyethylene (PE) films, polypropylene (PP) films, polymethylpentene (TPX) films and polyester films.

Use of the Adhesive Sheet

The adhesive sheet having the adhesive layer formed with the present adhesive composition can be used in the flip-chip mounting where bumps on a semiconductor wafer are directly connected to electrodes on a substrate. The present adhesive sheet can also be used for connecting semiconductor elements having through electrodes to each other.

FIGS. 2 to 8 show an embodiment of the mounting of a semiconductor wafer with the adhesive sheet having the adhesive layer formed with the present adhesive composition. Each step will be explained below.

Figure 2:
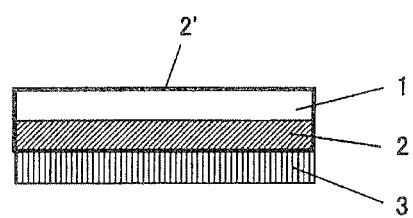
FIG. 2 shows an aspect where an adhesive sheet having an adhesive layer made of the present adhesive composition is pressure bonded on a semiconductor wafer.

[Step 1: FIG. 2]

An adhesive sheet (2') formed by laminating a protective layer (1) and an adhesive layer (2) is bonded to a functional face, i.e. face with bumps, of a semiconductor wafer (3) with heat and pressure. The heat and pressure bonding is conducted at a temperature of from 80 to 130 degrees C. and a pressure of from 0.01 to 1 Mpa for a time of from 5 to 300 seconds. Alternatively, the adhesive sheet is bonded at a pressure of from 50 to 1300 Pa under vacuum and, then, allowed to be at atmospheric pressure.

Figure 3:
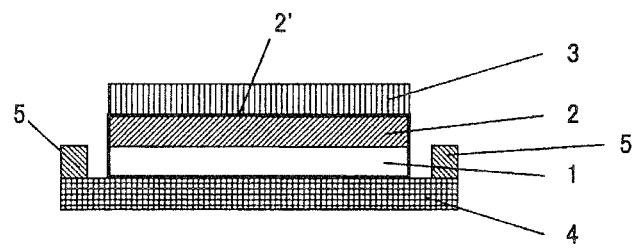
FIG. 3 shows an aspect where a semiconductor wafer is mounted on a protective tape for a semiconductor device via an adhesive sheet having the adhesive layer made of the present adhesive composition.

[Step 2: FIG. 3]

The protective layer (1) of the adhesive sheet (2') bonded on the semiconductor wafer (3) is bonded on a protective tape for semiconductor processing (4) and supported with a wafer ring (5). Any commercial protective tape for semiconductor processing, such as back-ground tapes and dicing tapes can be used generally, and may be selected properly. The protective tape for semiconductor processing (4) can be bonded directly on the adhesive layer (2) without the protective layer (1). The step of bonding the adhesive sheet on the tape may be conducted at a temperature of from 20 to 40 degrees C. and a linear pressure of 5 to 50 N/cm for a pressure time of 5 to 60 seconds. This step may be conducted with another adhesive tape. The adhesive sheet may be bonded on the tape at 50 to 1300 Pa under vacuum and, then, allowed to be at atmospheric pressure.

Figure 4:
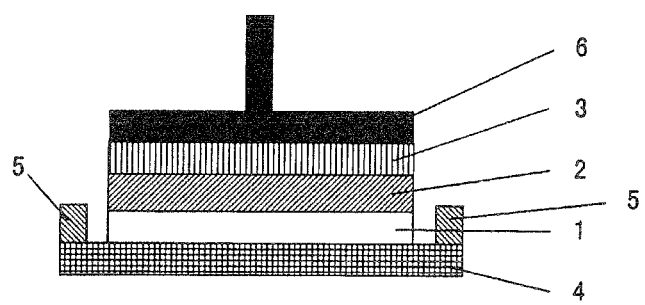
FIG. 4 shows an aspect where a semiconductor wafer is ground.

[Step 3: FIG. 4]

Subsequently, the protective tape for semiconductor processing (4) is fixed on a grinding (polishing) stage (not shown in the figure) and the semiconductor wafer (3) is ground (polished) with a grind wheel (6). A grinding (polishing) apparatus having the grind wheel is not limited to particular one, and may be commercial products. The thickness of the semiconductor wafer after ground (polished) (7 in FIG. 5) is preferably approximately 30 to 600 µm, but not limited thereto.

Figure 5:
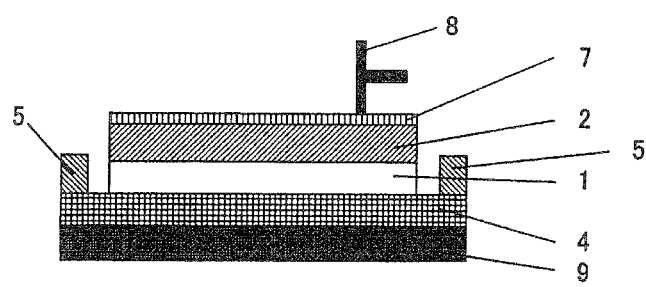
FIG. 5 shows an aspect where a semiconductor wafer is subjected to dicing.

[Step 4: FIG. 5]

The semiconductor wafer after ground (polished) (7) is placed on a dicer table (9) in so as that the protective tape for the semiconductor processing (4) comes into contact with the dicer table (9). The semiconductor wafer (7), the protective layer (1) and the adhesive layer (2) are cut together with a dicing blade (8) equipped on a dicing saw (not shown in the figure). The spindle rotation speed and a cutting rate in dicing may be selected properly. In general, the spindle rotation speed is 25,000 to 45,000 rpm and the cutting rate is 10 to 50 mm/sec.

Figure 6:
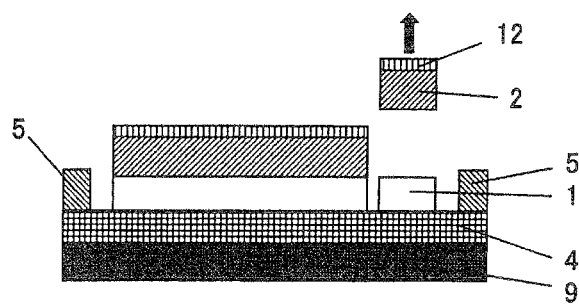
FIG. 6 shows an aspect where a cut semiconductor chip is picked up.

[Step 5: FIG. 6]

The protective tape for semiconductor processing (4) is expanded with an expanding machine to make a certain gap between the semiconductor chips (12) which has been separated together with the adhesive sheet (2'). The adhesive layer (2) is peeled from the protective layer (1) and the semiconductor chip (12) is picked up together with the adhesive layer.

Figure 7:
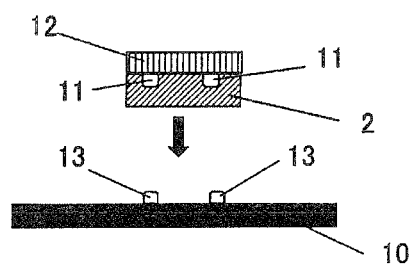
FIG. 7 shows an aspect where the semiconductor chip picked up is positioned and mounted on a base substrate.

[Step 6: FIG. 7]

Bumps (11) provided on the functional face of the cut semiconductor chip (12) is aligned with electrodes (13) on a base substrate (10) with a flip chip bonder (not shown in the figure) and, then, the semiconductor chip (12) is placed on the base substrate (10).

Figure 8:
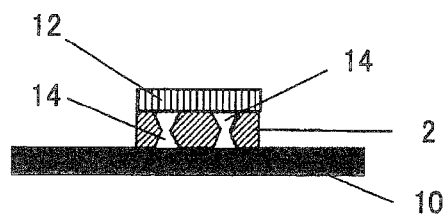
FIG. 8 shows an aspect where the semiconductor chip and the base substrate are soldered.

[Step 7: FIG. 8]

The bumps (11) provided on the functional face of the cut semiconductor chip (12) are bonded to the electrodes (13) on the base substrate (10) with heat and pressure. The heat and pressure bonding is generally conducted at a temperature of from 100 to 280 degrees C. and a load of from 1 to 500 N for a time of from 1 to 30 seconds, followed by heating to cure the adhesive composition so as to seal gaps between the semiconductor chip (12) and the base substrate (10). The curing of the adhesive composition is generally conducted at a temperature of from 160 to 240 degrees C., preferably from 180 to 220 degrees C., for 0.5 to 6 hours, preferably 1 to 4 hours.

Figure 9:
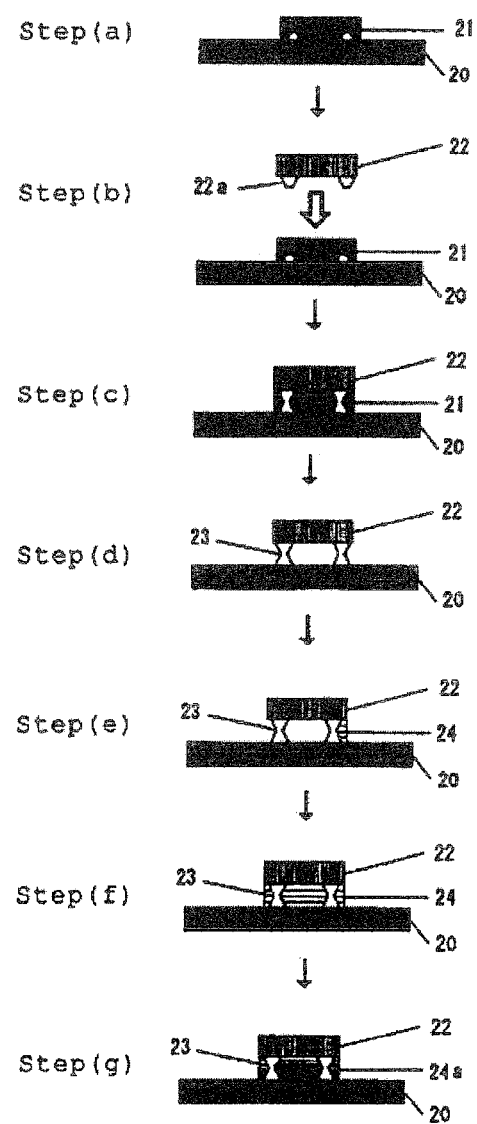
FIG. 9 is flow diagram which shows a flip-chip mounting process in a capillary underfill method.

As stated above, the use of the adhesive layer made of the present adhesive composition allows one to omit the steps (a), (d), (e) and (f) which are required in the capillary underfill method (FIG. 9). Additionally, the adhesive layer made of the present adhesive composition shows excellent adhesiveness to the base substrate in pressure bonding. Further, the adhesive layer after cured has excellent connection and insulation reliability.

Protective Material for a Semiconductor Device

Further, the present invention provides a protective material, for a semiconductor device, having an adhesive layer formed with the adhesive composition. An embodiment of the protective material for the semiconductor device is a protective sheet where the adhesive layer formed with the present adhesive composition is laminated on the protective tape for semiconductor processing. The adhesive layer of the protective sheet is bonded on a surface of the semiconductor device to be protected, the protective sheet is peeled off and, then, the adhesive layer is cured to form a protective coating to protect the surface of the semiconductor device. The cured product of the present adhesive composition has good connection and insulation reliability, and, therefore, works suitably as a protective coating for semiconductor devices and electronic parts, such as diodes, transistors, ICs and LSIs. Embodiments of the protective coating include junction coatings, passivation coatings and buffer coatings on surface of semiconductor elements such as diodes, transistors, ICs and LSIs; alpha ray blocking coatings for LSIs; interlayer insulators for multilayer wirings; conformal coatings for printed circuit boards; ion implantation masks; and surface protection films for solar cells.

Semiconductor Device

As stated above, one aspect of the present method of preparing a semiconductor device is such that a semiconductor chip is placed to the base substrate via the adhesive layer formed with the present adhesive composition and, then the adhesive composition is cured. Another aspect is such that the protective material, for a semiconductor device, having the adhesive layer formed with the present adhesive composition is bonded on the surface to be protected of the semiconductor device (adhered) and, then, the adhesive composition is cured to form a protective coating. The present adhesive composition has excellent film-forming ability and adhesiveness to a substrate and provides a cured product which has excellent connection and insulation reliability, i.e. migration resistance, under high temperature and high humidity conditions, so that is suitably applied for high density and highly integrated semiconductor devices.

EXAMPLES

The present invention will be explained below in further detail with reference to a series of the Examples and Comparative Examples, though the present invention is in no way limited by these Examples.

In the following descriptions, the weight-average molecular weight of the polymer is determined by gel permeation chromatography (GPC) with monodisperse polystyrene as a standard under analysis conditions where a GPC column is TSK gel Super HZM-H, ex TOSO Co. Ltd., a flow rate is 0.6 ml/min., an eluting solvent is tetrahydrofuran and a column temperature is 40 degrees C. $^1$H-NMR analysis of the polymer is carried out using JNM-LA300WB, ex JEOL Ltd. with deuterochloroform as a solvent.

The compounds used in Examples 1 to 5 were as follows.

(S-1)

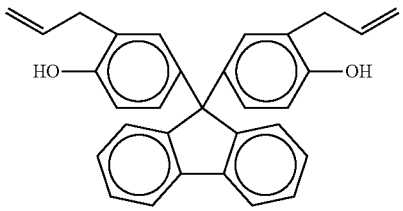

(S-2: ex Sigma-Aldrich Co.)

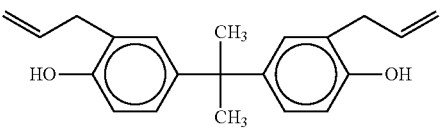

(S-3: ex Shine-Etsu Chemical Co. Ltd.)

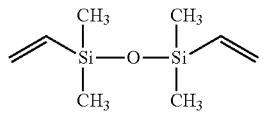

(S-4: ex Shine-Etsu Chemical Co. Ltd.)

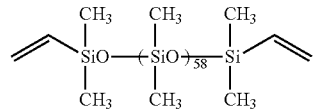

(S-5: ex Shikoku Chemicals Corporation)

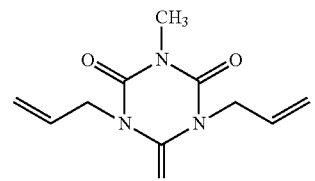

(S-6: ex Shine-Etsu Chemical Co. Ltd.)

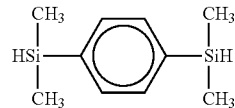

(S-7: ex Shine-Etsu Chemical Co. Ltd.)

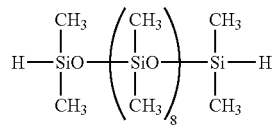

(S-8: ex Shine-Etsu Chemical Co. Ltd.)

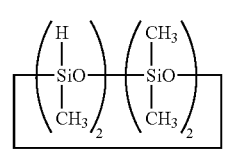

(S-9: ex Shine-Etsu Chemical Co. Ltd.)

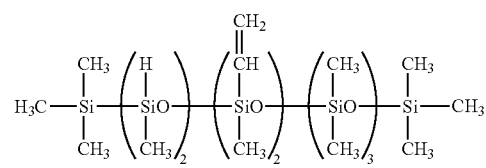

Example 1

To a three-liter flask equipped with a stirring device, a thermometer, a nitrogen inflow instrument and a reflux condenser, were added 86.1 g (0.2 mol) of the compound represented by the formula (S-1), 93.0 g (0.5 mol) of the compound represented by the formula (S-3) and 66.9 g (0.3 mol) of the compound represented by the formula (S-5) and, then, added 1300 g of toluene and heated to 70 degrees C. To the mixture, was added 1.0 g of a chloroplatinic acid solution in toluene (platinum content: 0.5 wt %) and added dropwise 194.4 g (1.0 mol) of the compound represented by the formula (S-6) over 1 hour (the total mole of the hydrosilyl group/the total mole of the alkenyl group=1/1). After the addition, the mixture was heated to 100 degrees C. and aged for 6 hours and, then, the toluene was distilled off from the reaction solution under a reduced pressure to obtain a product. The product was analized by $^1$H-NMR and found to be a polymer represented by the following formula. The chart of $^1$H-NMR spectra is shown in FIG. 1. The weight-average molecular weight of the polymer was 42,000, as determined by GPC, reduced to polystyrene.

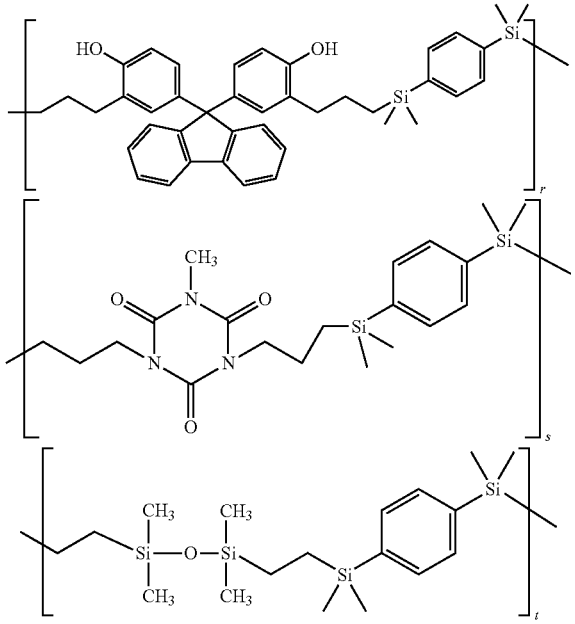

wherein r/(r+s+t) is 0.2, s/(r+s+t) is 0.3 and t/(r+s+t) is 0.5. The terminal silicon atom in the units bonds to the terminal carbon atom in the same or different unit. One terminal of the polymer is an alkenyl group and the other terminal is a hydrogen atom bonded to a silicon atom.

Example 2

To a three-liter flask equipped with a stirring device, a thermometer, a nitrogen inflow instrument and a reflux condenser, were added 71.8 g (0.167 mol) of the compound represented by the formula (S-1), 333.3 g (0.074 mol) of the compound represented by the formula (S-4) and 14.9 g (0.067 mol) of the compound represented by the formula (S-5) and, then, added 1150 g of toluene and heated to 70 degrees C. To the mixture, was added 1.0 g of a chloroplatinic acid solution in toluene (platinum content: 0.5 wt %) and added dropwise 64.8 g (0.333 mol) of the compound represented by the formula (S-6) over 30 minutes (the total mole of the hydrosilyl group/the total mole of the alkenyl group=1.08/1). After the addition, the mixture was heated to 100 degrees C. and aged for 6 hours and, then, the toluene was distilled off from the reaction solution under a reduced pressure to obtain a product. The product was analyzed by $^1$H-NMR and found to be a polymer represented by the following formula. The weight-average molecular weight of the polymer was 55,000, as determined by GPC, reduced to polystyrene.

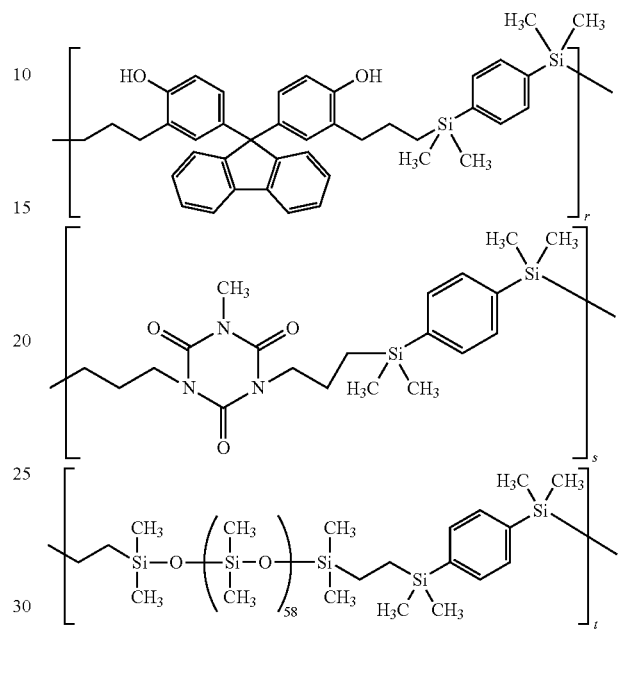

wherein r/(r+s+t) is 0.5, s/(r+s+t) is 0.2 and t/(r+s+t) is 0.3. The terminal silicon atom in the units bonds to the terminal carbon atom in the same or different unit. One terminal of the polymer is an alkenyl group and the other terminal is a hydrogen atom bonded to a silicon atom.

Example 3

To a three-liter flask equipped with a stirring device, a thermometer, a nitrogen inflow instrument and a reflux condenser, were added 61.8 g (0.2 mol) of the compound represented by the formula (S-2), 93.0 g (0.5 mol) of the compound represented by the formula (S-3) and 66.9 g (0.3 mol) of the compound represented by the formula (S-5) and, then, added 1000 g of toluene and heated to 70 degrees C. To the mixture, was added 1.0 g of a chloroplatinic acid solution in toluene (platinum content: 0.5 wt %) and added dropwise 179.0 g (0.92 mol) of the compound represented by the formula (S-6) and 54.8 g (0.075 mol) of the compound represented by the formula (S-7) over 1 hour (the total mole of the hydrosilyl group/the total mole of the alkenyl group=1/1). After the addition, the mixture was heated to 100 degrees C. and aged for 6 hours and, then, the toluene was distilled off from the reaction solution under a reduced pressure to obtain a product. The product was analized by $^1$H-NMR and found to be a polymer represented by the following formula. The weight-average molecular weight of the polymer was 52,000, as determined by GPC, reduced to polystyrene.

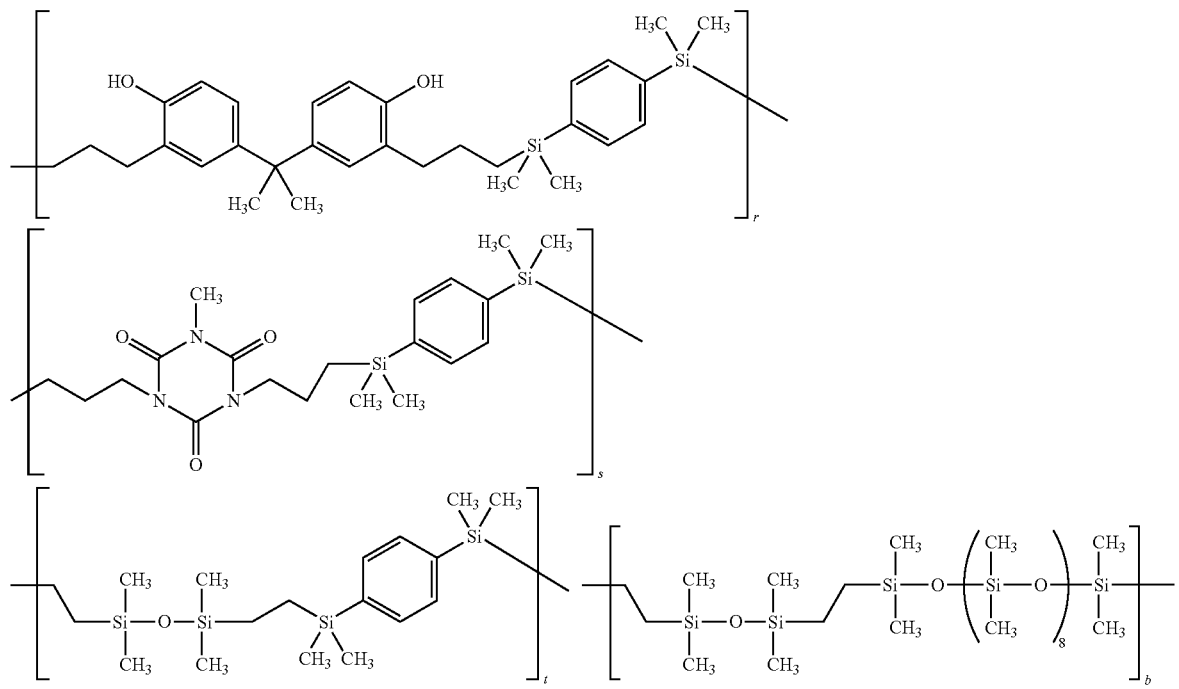

wherein r/(r+s+t+b) is 0.2, s/(r+s+t+b) is 0.3, t/(r+s+t+b) is 0.4 and b/(r+s+t+b) is 0.1. The terminal silicon atom in the units bonds to the terminal carbon atom in the same or different unit. One terminal of the polymer is an alkenyl group and the other terminal is a hydrogen atom bonded to a silicon atom.

Example 4

To a three-liter flask equipped with a stirring device, a thermometer, a nitrogen inflow instrument and a reflux condenser, were added 61.8 g (0.2 mol) of the compound represented by the formula (S-2), 93.0 g (0.5 mol) of the compound represented by the formula (S-3) and 66.9 g (0.3 mol) of the compound represented by the formula (S-5) and, then, added 1000 g of toluene and heated to 70 degrees C. To the mixture, was added 1.0 g of a chloroplatinic acid solution in toluene (platinum content: 0.5 wt %) and added dropwise 179.0 g (0.92 mol) of the compound represented by the formula (S-6) over 1 hour. After the addition, the mixture was heated to 100 degrees C. and aged for 6 hours and, then, 26.8 g (0.083 mol) of the compound represented by the formula (S-8) added dropwise over 1 hour (the total mole of the hydrosilyl group/the total mole of the alkenyl group=1/1). After the addition, the mixture was aged at 100 degrees C. for 2 hours and, then, the toluene was distilled off from the reaction solution under a reduced pressure to obtain a product. The product was analized by $^1$H-NMR and found to be a polymer represented by the following formula. The weight-average molecular weight of the polymer was 66,000, as determined by GPC, reduced to polystyrene.

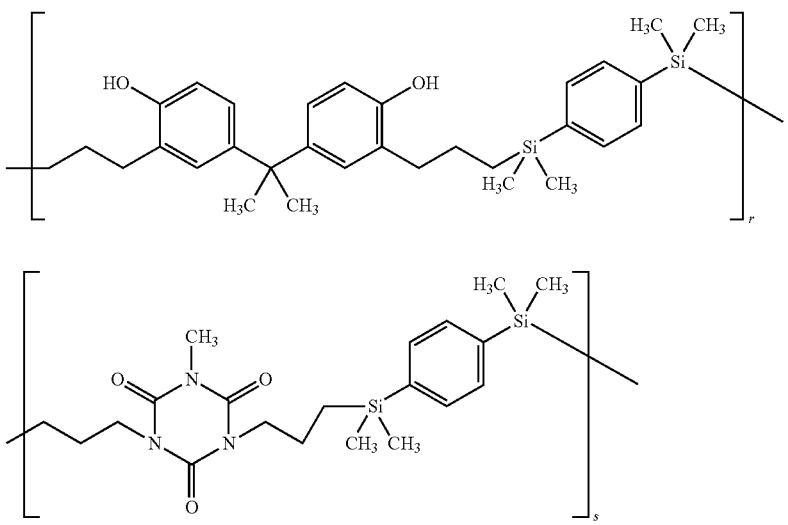

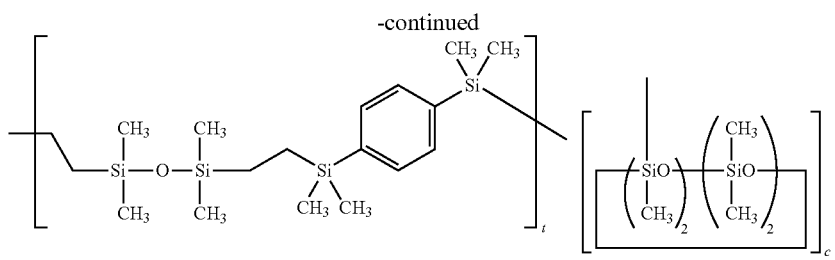

wherein r/(r+s+t+c) is 0.2, s/(r+s+t+c) is 0.3, t/(r+s+t+c) is 0.4 and c/(r+s+t+c) is 0.1. The terminal silicon atom in the units bonds to the terminal carbon atom in the same or different unit. One terminal of the polymer is an alkenyl group and the other terminal is a hydrogen atom bonded to a silicon atom.

Example 5

To a three-liter flask equipped with a stirring device, a thermometer, a nitrogen inflow instrument and a reflux condenser, were added 142.1 g (0.33 mol) of the compound represented by the formula (S-1), 70.7 g (0.38 mol) of the compound represented by the formula (S-3) and 66.9 g (0.3 mol) of the compound represented by the formula (S-5) and, then, added 1500 g of toluene and heated to 70 degrees C. To the mixture, was added 2.0 g of a chloroplatinic acid solution in toluene (platinum content: 0.5 wt %) and added dropwise 190.5 g (0.98 mol) of the compound represented by the formula (S-6) over 1.5 hours. After the addition, the mixture was heated to 100 degrees C. and aged for 6 hours and, then, 6.8 g (0.01 mol) of the compound represented by the formula (S-9) was added dropwise over 0.1 hours (the total mole of the hydrosilyl group/the total mole of the alkenyl group=1/1.03). After the addition, the mixture was aged at 100 degrees C. for 2 hours and, then, the toluene was distilled off from the reaction solution under a reduced pressure to obtain a product. The product was analized by $^1$NMR and found to be a polymer represented by the following formula. The weight-average molecular weight of the polymer was 50,000, as determined by GPC, reduced to polystyrene.

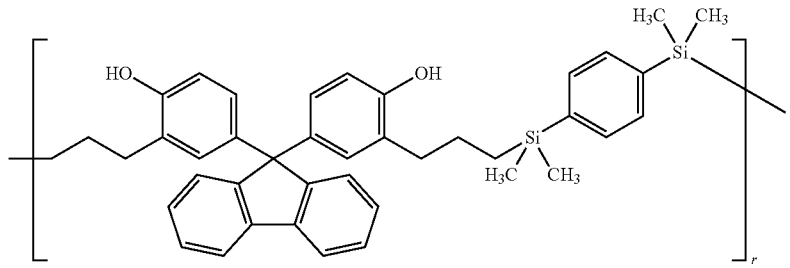

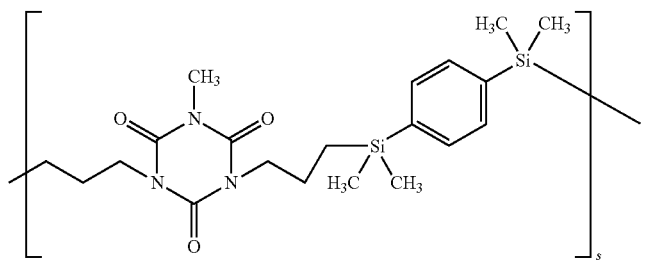

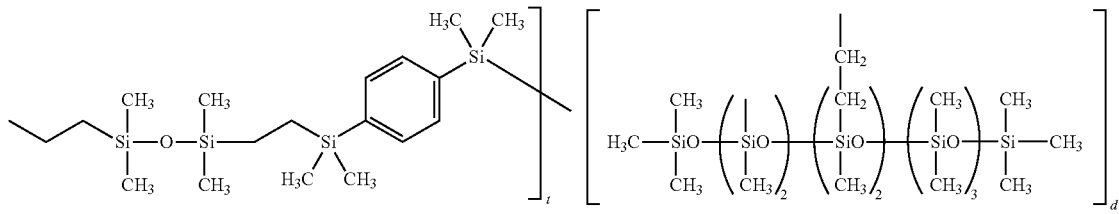

wherein r/(r+s+t+d) is 0.32, s/(r+s+t+d) is 0.29, t/(r+s+t+d) is 0.37 and d/(r+s+t+d) is 0.01. The terminal silicon atom in the units bonds to the terminal carbon atom in the same or different unit. One terminal of the polymer is an alkenyl group and the other terminal is a hydrogen atom bonded to a silicon atom.

Examples 6 to 14 and Comparative Examples 1 to 4

Preparation of an Adhesive Composition

The polymers (A) prepared in Examples 1 to 5, a thermosetting resin (B), a compound having flux activity (C) and other optional components were mixed in the formulations shown in Table 1. Additionally, cyclopentanone was added in such an amount that the solid content was 50 mass %, and stirred with a ball mill for mixing and dissolving to prepare a dispersion of the adhesive composition. In the Table 1, the amounts are indicated in "part by mass". Comparative Example 1 is for an adhesive composition which does not contain the thermosetting resin (B). Comparative Example 2 is for an adhesive composition which does not contain the compound having flux activity (C). Comparative Example 3 is for an adhesive composition which does not contain the polymer (A) and Comparative Example 4 is for an adhesive composition described in Japanese Patent Application Laid-Open No. 2009-239138, which comprises an epoxy resin, an acrylic resin and a compound having flux activity.

The components used for preparing the adhesive compositions were as follows.
(B) Thermosetting Resin
EOCN-1033(trade name) (ex Nippon Kayaku Co. Ltd, epoxy equivalent: 209 to 219)
jER1001(trade name) (ex Mitsubishi Chemical Corporation, epoxy equivalent: 450 to 500)
NC6000(trade name) (ex Nippon Kayaku Co. Ltd, epoxy equivalent: 192 to 202)
Here, an epoxy equivalent and an OH equivalent mean an equivalent of an epoxy group or an OH group in one molecular of each component.

Additionally, the following epoxy resin curing agent and epoxy resin curing accelerator were used.
Epoxy Resin Curing Agent:
RIKACID HH (trade name) (ex Shin Nihon Rika Co., Ltd., hexahydrophthalic anhydride)
Phenolite TD-2093 (trade name) (ex DIC Corporation, OH equivalent: 104)
Epoxy Resin Curing Accelerator:
CUREZOL 2P4 MHZ (trade name) (ex Shikoku Chemicals Corporation, 2-phenyl-4-methyl-5-hydroxymethyl imidazole)
(C) Compound Having Flux Activity
Phenolphthalein, ex Wako Pure Chemical Industries Ltd.
Sebacic acid, ex Wako Pure Chemical Industries Ltd.
Other Optional Compounds
Inorganic filler: silica (ex Admatechs Co. Ltd., SE1050, mean particle size of 0.25 μm)
Coupling agent: KBM-303 (ex Shine-Etsu Chemical Co. Ltd., β-(3,4-epoxycyclohexyl)ethyltrimethoxysilane)
Acrylic rubber: SG-708-6 (ex Nagase ChemteX Corporation, butylacrylate-ethylacrylate-acrylonitrile-acrylic acid-2-hydroxyethyl copolymer, weight-average molecular weight of 700,000)
Preparation of an Adhesive Sheet
The dispersion of the adhesive composition was applied with a dry thickness of 25 μm on a surface of a polyester film (protective layer, ex Toyobo Co., Ltd.) which has been treated with a release agent using an applicator in such a way and, then, dried in a fan oven at 130 degrees C. for 5 minutes to form an adhesive layer to prepare an adhesive sheet having the adhesive layer. Properties of each adhesive sheet were evaluated in accordance with the evaluation methods as shown below. The results are as shown in Table 1.

Evaluation 1: Flexibility of the Adhesive Layer

Each adhesive sheet was bended at 180 degrees in such a way that the adhesive layer of the adhesive sheet was on the outer side and the polyester film side of the adhesive sheet was on the inner side. When the adhesive layer had cracks or peeled from the polyester film, the flexibility of the adhesive layer was rated as "Bad". When the adhesive layer had no crack and did not peel, the flexibility of the adhesive layer was rated as "Good". The results are as shown in Table 1. "Good" means that the product can be used.

Evaluation 2: Adhesiveness of the Adhesive Layer

Each adhesive sheet was bonded on a 6-inch semiconductor wafer (thickness: 625 μm, ex Shine-Etsu Chemical Co., Ltd.) using a vacuum film-laminating machine (temperature: 110 degrees C., pressure: 80 Pa, TEAM-100, ex Takatori Corporation), as shown in FIG. 2. Subsequently, the polyester film side of the adhesive sheet was bonded on a dicing tape (ex Denki Kagaku Kogyo Co., Ltd.) supported with a wafer ring at a linear pressure of approximately 10 N/cm and room temperature, as shown in FIG. 3. The semiconductor wafer and the adhesive sheet were cut into a size of 2 mm×2 mm square, using a dicing saw equipped with a dicing blade (DAD685, ex DISCO Corporation), as shown in FIG. 5. The adhesive layer was peeled off from the polyester film and the separated semiconductor chip was picked up to obtain the semiconductor chip having the adhesive layer, as shown in FIG. 6. The spindle speed was 30,000 rpm and the cutting rate was 50 mm/sec in dicing. The separated semiconductor chip was bonded on a silicon wafer (base substrate) having a size of 15 mm×15 mm square via the adhesive layer at 150 degrees C. and a load of 50 mN. Then, the adhesive composition was cured at 180 degrees C. for one hour to obtain a test piece. Five test pieces were subjected to the following adhesion strength determination test.

Figure 10:
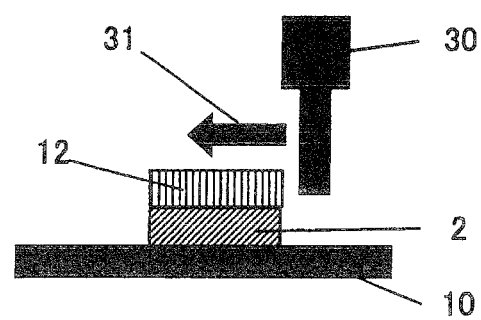
FIG. 10 shows a test to determine adhesiveness of an adhesive layer to the substrate.

The semiconductor chip (2 mm×2 mm) was peeled from the base substrate (silicon wafer of 15 mm×15 mm square) using a bond tester (Dage series 4000-PXY, ex Dage Co. Ltd.) to determine resistance against the peeling to evaluate the adhesion strength of the adhesive layer was evaluated. The test was carried out at such conditions that a test speed was 200 μm/sec. and a test height was 50 μm. The adhesion strength determination test is as shown in FIG. 10. In FIG. 10, an arrow (31) indicated the direction of movement of the measurement jig (30) of the bond tester. The results are as shown in Table 1. The value shown in Table 1 is an average of the values of the five test pieces. A larger value means a larger adhesion strength.

Evaluation 3: Connection Reliability

In accordance with the afore-mentioned method of preparing the adhesive sheet, an adhesive sheet having an adhesive layer of thickness of 50 μm was prepared. A bump-bearing face of a semiconductor wafer (8 inch, thickness of 725 μm) was bonded to the adhesive layer sideS of the adhesive sheet using a vacuum film-laminating machine (temperature: 110 degrees C., pressure: 80 Pa), as shown in FIG. 2. Subsequently, the protective layer side of the semiconductor wafer provided with the adhesive sheet was bonded on a backgrind tape (ex Denki Kagaku Kogyo Co., Ltd.) supported with a wafer ring, at a linear pressure of approximately 10 N/cm and room temperature, as shown in FIG. 3. The semiconductor wafer was ground (polished) to become a thickness of 100 μm using a grinding (polishing) machine (DAG810, ex DISCO Corporation), as shown in FIG. 4.

Next, the semiconductor wafer was cut into a size of 10 mm×10 mm square using dicing saw equipped with a dicing blade, as shown in FIG. 5, and the separated semiconductor chip was picked up, as shown in FIG. 6, to obtain the semiconductor chip provided with the adhesive layer (80 μmφ, bump: Sn-3Ag-0.5Cu, height of bump: 50 μm, pitch: 150 μm, the number of bumps: 3,844). The spindle speed was 40,000 rpm and the cutting rate was 30 mm/sec in dicing.

The semiconductor chip provided with the adhesive layer was aligned and placed on a bismaleimide-triazine (BT) resin substrate (thickness: 0.94 mm) which had been coated with a solder resist (ex Taiyo Ink Co., Ltd, PSR4000 AUS703) using a flip chip bonder, as shown in FIG. 7 and, then, subjected to heat and pressure bonding at 255 degrees C. for 15 seconds to prepare each ten flip-chip packages. Subsequently, each package was heated at 180 degrees C. for one hour to cure the adhesive layer.

Each ten flip-chip packages prepared in the afore-mentioned method were subjected to the connection resistance measurement to confirm the initial conduction. Subsequently, each package was subjected to a heat cycle test (repeated 1000 cycles between a state at −25 degrees C. for 10 minutes and a state at 125 degrees C. for 10 minutes) to confirm the conduction after the heat cycle test. The package which showed the conduction in the both tests was rated as "Good"; the package which had the initial conduction, but did not have the conduction after the heat cycle test was rated as "Not So Good"; and the package which did not have the initial conduction was rated as "Bad" to evaluate the connection reliability. The results are as shown in Table 1. "Good" means that the product can be used.

Evaluation 4: Insulation Reliability, i.e. Migration Resistance

A comb shaped circuit with a thickness of Cu of 5 μm and line width/space width of 20 μm/20 μm was formed on a glass substrate. The adhesive layer side of the adhesive sheet was bonded on the substrate to cover the tandem circuit using a vacuum film laminating machine (temperature: 110 degrees C., pressure: 80 Pa) and the terminals were masked with a masking tape. Then, the protective layer of the adhesive sheet was peeled off and adhesive sheet was heated at 180 degrees C. for one hour to cure to prepare each five samples for evaluating the insulation reliability. A direct current of 10 V was applied to the two poles of the circuit of each test piece at 85 degrees C. and 85% relative humidity to evaluate the insulation reliability using emigration tester (MIG-86, ex IMV corporation). After applying the voltage, when a short (decreased resistance) took place between the conductors within 1,000 hours or dendrites grew, the insulation reliability was rated as a fault and indicated "Bad". When the resistance was maintained after 1,000 hours and no dendrite took place, the insulation reliability was rated as "Good". The results are as shown in Table 1.

TABLE 1

| | Components | | Example 6 | 7 | 8 | 9 | 10 | 11 | 12 | 13 | 14 | Comparative Example 1 | 2 | 3 | 4 |
|---|---|---|---|---|---|---|---|---|---|---|---|---|---|---|---|
| A | Polymer | Example 1 | 100 | 100 | 100 | 100 | | | | | 100 | 100 | 100 | | |
| | | Example 2 | | | | | 100 | | | | | | | | |
| | | Example 3 | | | | | | 100 | | | | | | | |
| | | Example 4 | | | | | | | 100 | | | | | | |
| | | Example 5 | | | | | | | | 100 | | | | | |
| B | Thermosetting resin | EOCN-103S | 20 | 10 | 10 | 20 | 20 | 20 | 20 | 20 | 250 | | 20 | 100 | |
| | | jER1001 | | 10 | 10 | | | | | | | | | | |
| | | NC6000 | | | | | | | | | | | | | 161 |
| | | Phenolite TD-2093 | | 5 | | | | | | | 150 | | | 60 | 35 |
| | | RIKACID HH | | | 5 | | | | | | | | | | |
| | | CUREZOL 2P4MHZ | 1 | 1 | 1 | 1 | 1 | 1 | 1 | 1 | 5 | | 1 | 2 | 0.3 |
| C | Compound having flux activity | Phenolphthalein | 6 | 6 | 6 | 6 | 6 | 6 | 6 | 6 | | 5 | | | 44 |
| | | Sebacic acid | | | | | | | | | 25 | | | 10 | |
| Others | Inorganic filler | SE1050 | | | | 40 | | | | | | | | | |
| | Coupling agent | KBM-303 | | 1 | 1 | | | | | | | | | | 1.8 |
| | Acrylic rubber | SG-708-6 | | | | | | | | | | | | | 100 |
| | Flexibility of the adhesive layer | | Good | Good | Good | Good | Good | Good | Good | Good | Good | Good | Good | Bad | Good |
| | Adhesiveness, MPa | | 28.8 | 30.2 | 29.3 | 28.8 | 29.9 | 31.5 | 31.3 | 30.4 | 29.7 | 19.5 | 28.5 | 24.5 | 23.0 |
| | Connection reliability | | Good | Good | Good | Good | Good | Good | Good | Good | Good | Bad | Bad | Good | Good |
| | Insulation reliability | | Good | Good | Good | Good | Good | Good | Good | Good | Good | Good | Good | Good | Bad |

The connection reliability was "Good" in all of the ten packages in Examples 6 to 14 and Comparative Examples 3 and 4. The connecting reliability was "Bad" in all of the ten packages in Comparative Examples 1 and 2. The insulation reliability was "Good" in all of the five packages in Examples 6 to 14 and Comparative Examples 1 to 3. The insulation reliability was "Bad" in the each five packages in Comparative Examples 4 and 5.

As shown in Table 1, the adhesive composition which did not comprise the film-forming resin had poor flexibility of the adhesive layer (Comparative Example 3). The cured product described in Japanese Patent Application Laid-Open No. 2009-239138 had good flexibility of the adhesive layer, but caused migration and had the poor insulation reliability (Comparative Example 4). In contrast, the adhesive layers formed with the present adhesive composition had the superior flexibility of the adhesive layer and the adhesiveness in bonding to the substrate and, further, the cured product of the present adhesive composition had the superior connection and insulation reliability. Additionally, the semiconductor device protected with the present adhesive layer had the good connection and insulation reliability. The adhesive composition having no thermosetting resin in Comparative Example 1 had the poor adhesiveness and connection reliability. The adhesive composition having no compound having flux activity in Comparative Example 2 had the poor connection reliability.

INDUSTRIAL APPLICABILITY

The present polymer is used suitably as a resin material for semiconductor devices and electronic parts. Further, the present adhesive composition has excellent film-forming ability and adhesiveness to a substrate and provides a cured product which has excellent connection and insulation reliability, i.e. migration resistance under high temperature and high humidity conditions, so that it is suitably applied for high density and highly integrated semiconductor device.

DESCRIPTION OF THE SYMBOLS IN THE DRAWING

1: Protective layer
2: Adhesive Layer
2': Adhesive sheet
3: Semiconductor wafer
4: Protective tape for semiconductor processing
5: Wafer ring
6: Grind wheel
7: Semiconductor wafer after ground (polished)
8: Dicing blade
9: Dicer table
10: Base substrate
11: Bump
12: Separated semiconductor chip
13: Electrode
14: Junction between a semiconductor chip and a substrate
20: Circuit substrate
21: Flux
22: Semiconductor chip
22a: Bump on a semiconductor chip
23: Junction between a semiconductor chip and a substrate
24: Underfill material
25: Cured product of an underfill material
30: Measurement jig of a bond tester
31: Direction of movement of a measurement jig of a bond tester

The invention claimed is:

1. A polymer having repeating units represented by the following formulas (1-1), (1-2) and (1-3) and weight-average molecular weight of from 3,000 to 500,000, as determined by GPC using tetrahydrofuran as a solvent, reduced to polystyrene:

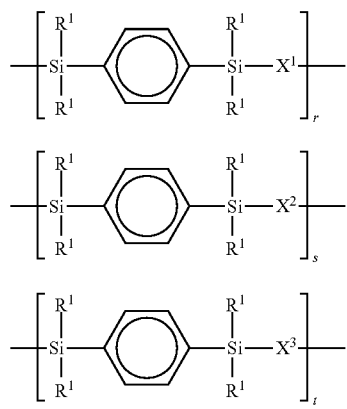

wherein r, s and t are positive integers, the terminal silicon atom in the each of the repeating units represented by the formulas (1-1), (1-2) and (1-3) bonds to the terminal carbon atom in $X^1$, $X^2$ or $X^3$ in the same or different unit, and $R^1$ is, independently of each other, a monovalent hydrocarbon group having 1 to 8 carbon atoms;

$X^1$ is, independently of each other, a divalent group represented by the following formula (2),

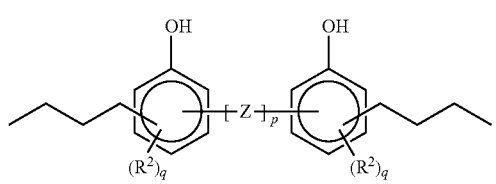

wherein Z is a substituted or unsubstituted divalent hydrocarbon group having 1 to 15 carbon atoms, p is 0 or 1, $R^2$ is, independently of each other, an alkyl or alkoxy group having 1 to 4 carbon atoms and q is 0, 1 or 2;

$X^2$ is, independently of each other, a divalent group represented by the following formula (3)

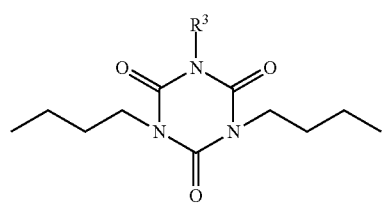

wherein $R^3$ is, independently of each other, a hydrogen atom, a monovalent hydrocarbon group having 1 to 8 carbon atoms or a glycidyl group;

$X^3$ is, independently of each other, a divalent group represented by the following formula (4)

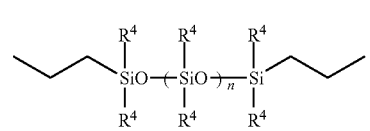

wherein $R^4$ is, independently of each other, a monovalent hydrocarbon group having 1 to 8 carbon atoms and n is an integer of from 0 to 100.

2. The polymer according to claim 1, wherein Z in the formula (2) is selected from the following groups:

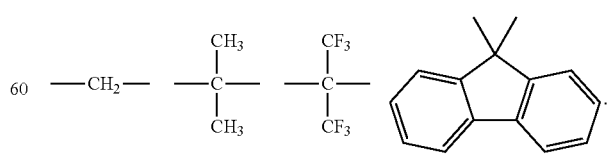

3. The polymer according to claim 1, wherein the polymer further has at least one selected from the group consisting of units represented by the following formula (5), (6) or (7).

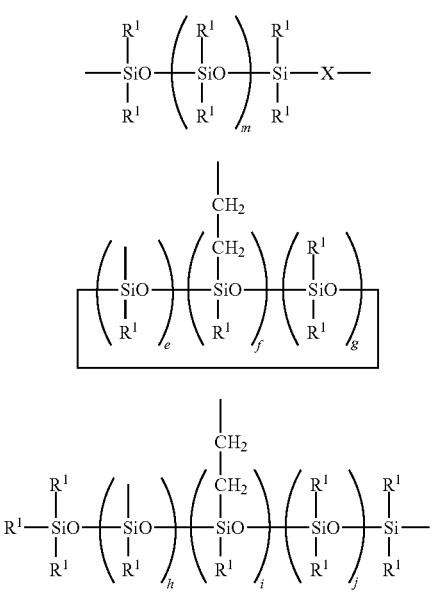

(5)

(6)

(7)

wherein $R^1$ is, independently of each other, a monovalent hydrocarbon group having 1 to 8 carbon atoms, m is an integer of from 0 to 100, e, f, g, h, i and j are integers of from 0 to 100, provided that e+f+g is not less than 3, e and f are not simultaneously zero and h and i are not simultaneously zero, X is, independently of each other, the group represented by the $X^1$, $X^2$ or $X^3$, and the terminal silicon atom in the repeating units represented by the formulas (1-1), (1-2) and (1-3) and the units represented by the formulas (5), (6) and (7) bonds to the terminal carbon atom in the same or different unit.

4. The polymer according to claim 1, wherein the polymer is composed of at least 5 mole % and at most 80 mole % of the group represented by $X^1$, at least 10 mole % and at most 70 mole % of the group represented by $X^2$ and at least 5 mole % and at most 80 mole % of the group represented by $X^3$, based on a total mole amount of the groups represented by $X^1$, $X^2$ and $X^3$.

5. A method of preparing the polymer according to claim 1, comprising a step where a compound represented by the following formula (8):

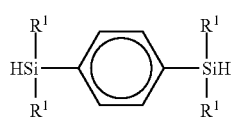

(8)

wherein $R^1$ is, independently of each other, a monovalent hydrocarbon group having 1 to 8 carbon atoms,
a compound represented by the following formula (9):

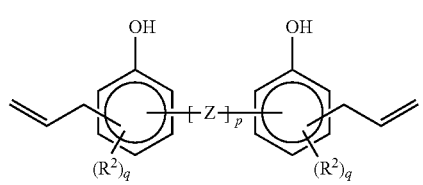

(9)

wherein Z is a substituted or unsubstituted divalent hydrocarbon group having 1 to 15 carbon atoms, p is 0 or 1, $R^2$ is, independently of each other, an alkyl or alkoxy group having 1 to 4 carbon atoms and q is 0, 1 or 2, a compound represented by the following formula (10):

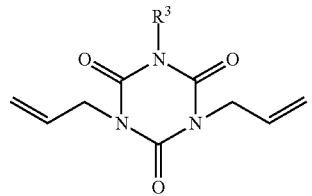

(10)

wherein $R^3$ is, independently of each other, a hydrogen atom, a monovalent hydrocarbon group having 1 to 8 carbon atoms or a glycidyl group, and
a compound represented by the following formula (11):

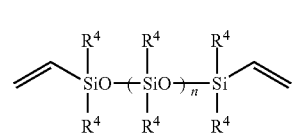

(11)

wherein $R^4$ is, independently of each other, a monovalent hydrocarbon group having 1 to 8 carbon atoms and n is an integer of from 0 to 100, are subjected to an addition reaction in the presence of a metal catalyst.

6. A method of preparing the polymer according to claim 3, comprising a step where a compound represented by the following formula (8):

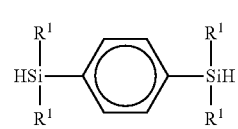

(8)

wherein $R^1$ is, independently of each other, a monovalent hydrocarbon group having 1 to 8 carbon atoms,
a compound represented by the following formula (9):

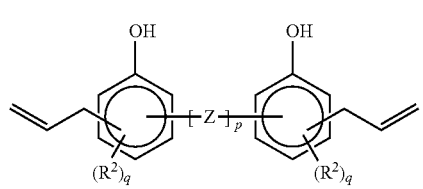

(9)

wherein Z is a substituted or unsubstituted divalent hydrocarbon group having 1 to 15 carbon atoms, p is 0 or 1, $R^2$ is, independently of each other, an alkyl or alkoxy group having 1 to 4 carbon atoms and q is 0, 1 or 2, a compound represented by the following formula (10):

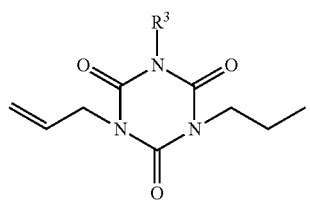

(10)

wherein $R^3$ is, independently of each other, a hydrogen atom, a monovalent hydrocarbon group having 1 to 8 carbon atoms or a glycidyl group, a compound represented by the following formula (11):

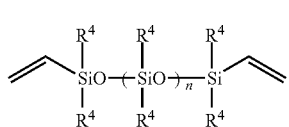

(11)

wherein $R^4$ is, independently of each other, a monovalent hydrocarbon group having 1 to 8 carbon atoms and n is an integer of from 0 to 100, and at least one compound selected from the group consisting of compounds represented by the following formulas (12), (13) and (14):

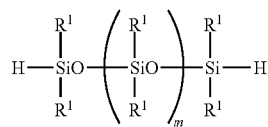

(12)

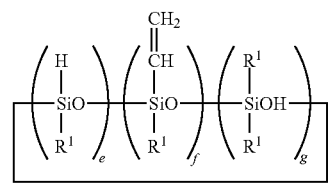

(13)

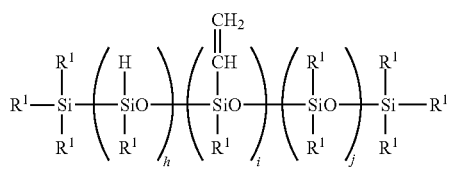

(14)

wherein $R^1$ is, independently of each other, a monovalent hydrocarbon group having 1 to 8 carbon atoms, m is an integer of from 1 to 100, e, f, g, h, i and j are integers of from 0 to 100, provided that e+f+g is not less than 3, e and f are not simultaneously zero and h and i are not simultaneously zero, are subjected to an addition reaction in the presence of a metal catalyst.

7. The method according to claim 5, wherein Z in the formula (9) is selected from the following groups:

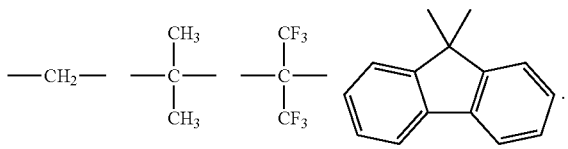

8. An adhesive composition comprising the following components (A), (B) and (C):

(A) the polymer according to claim 1, (B) a thermosetting resin, and (C) a compound having flux activity.

9. The adhesive composition according to claim 8, wherein an amount of the component (B) is 5 to 500 parts by mass, relative to 100 parts by mass of the component (A), and an amount of the component (C) is 1 to 20 parts by mass, relative to total 100 parts by mass of the components (A) and (B).

10. The adhesive composition according to claim 8, wherein the thermosetting resin is an epoxy resin.

11. The adhesive composition according to claim 10, wherein the adhesive composition further comprises at least one selected from an epoxy resin curing agent and an epoxy resin curing accelerator.

12. The adhesive composition according to claim 8, wherein the compound having flux activity has a carboxyl group or a phenolic hydroxyl group.

13. An adhesive sheet having an adhesive layer made of the adhesive composition according to claim 8.

14. A protective material for a semiconductor device wherein the protective material has an adhesive layer made of the adhesive composition according to claim 8.

15. A semiconductor device protected with the protective material according to claim 14.

16. A semiconductor device provided with a cured product of the adhesive composition according to claim 8.

* * * * *